(12) United States Patent
Kim et al.

(10) Patent No.: US 11,233,042 B2
(45) Date of Patent: Jan. 25, 2022

(54) THREE-DIMENSIONAL SEMICONDUCTOR MEMORY DEVICE

(71) Applicant: Samsung Electronics Co., Ltd., Suwon-si (KR)

(72) Inventors: Chanho Kim, Seoul (KR); Joo-Yong Park, Hwaseong-si (KR); Daeseok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/850,493

(22) Filed: Apr. 16, 2020

(65) Prior Publication Data

US 2021/0066277 A1 Mar. 4, 2021

(30) Foreign Application Priority Data

Sep. 2, 2019 (KR) .......................... 10-2019-0108222

(51) Int. Cl.
*H01L 25/18* (2006.01)
*H01L 27/11573* (2017.01)
(Continued)

(52) U.S. Cl.
CPC ............ *H01L 25/18* (2013.01); *H01L 23/528* (2013.01); *H01L 23/5223* (2013.01); *H01L 23/5226* (2013.01); *H01L 23/5227* (2013.01); *H01L 23/5228* (2013.01); *H01L 24/08* (2013.01); *H01L 27/11565* (2013.01); *H01L 27/11573* (2013.01); *H01L 27/11575* (2013.01);
(Continued)

(58) Field of Classification Search
CPC . H01L 25/18; H01L 23/5223; H01L 23/5226; H01L 23/5227; H01L 23/5228; H01L 23/528; H01L 24/08; H01L 27/11565; H01L 27/11573; H01L 27/11575; H01L 27/11582; H01L 28/60; H01L 2224/08146; H01L 2924/14511

USPC ......................................................... 257/324
See application file for complete search history.

(56) References Cited

U.S. PATENT DOCUMENTS 9,558,945 B2 1/2017 Fukuzumi et al.
9,876,031 B1 1/2018 Shimizu et al.
(Continued)

OTHER PUBLICATIONS

Notice of Allowance dated Sep. 21, 2021 from the US Patent Office for Related U.S. Appl. No. 17/002,149.

*Primary Examiner* — Tu-Tu V Ho
(74) *Attorney, Agent, or Firm* — Muir Patent Law, PLLC

(57) ABSTRACT

A three-dimensional semiconductor memory device, including a first chip and a second chip stacked on the first chip may be provided. The first chip may include a first substrate including a first peripheral circuit region and a second peripheral circuit region, first contact plugs, and second contact plugs, and a passive device on and electrically connected to the second contact plugs. The second chip may include a second substrate including a cell array region and a contact region, which vertically overlap the second peripheral circuit region and the first peripheral circuit region of the first chip, respectively. The second chip may further include gate electrodes, and cell contact plugs disposed on the contact region of the second substrate and on end portions of the gate electrodes. The first passive device may be vertically between the gate electrodes and the second contact plugs and may include a first contact line.

20 Claims, 15 Drawing Sheets

(51) Int. Cl.
  *H01L 23/528*      (2006.01)
  *H01L 23/522*      (2006.01)
  *H01L 27/11582*    (2017.01)
  *H01L 49/02*       (2006.01)
  *H01L 27/11565*    (2017.01)
  *H01L 23/00*       (2006.01)
  *H01L 27/11575*    (2017.01)

(52) U.S. Cl.
  CPC ........ *H01L 27/11582* (2013.01); *H01L 28/60* (2013.01); *H01L 2224/08146* (2013.01); *H01L 2924/14511* (2013.01)

(56) References Cited

U.S. PATENT DOCUMENTS

| | | |
|---|---|---|
| 10,049,743 B2 | 8/2018 | Lee |
| 10,283,452 B2 | 5/2019 | Zhu et al. |
| 10,297,578 B2 | 5/2019 | Tagami et al. |
| 10,903,216 B2* | 1/2021 | Kim .................... G11C 11/4085 |
| 10,998,316 B2 | 5/2021 | Lee |
| 2018/0358408 A1 | 12/2018 | Lee et al. |
| 2019/0123088 A1 | 4/2019 | Kwon |
| 2021/0066276 A1* | 3/2021 | Kim ........................ H01L 25/18 |

* cited by examiner

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2019-0108222, filed on Sep. 2, 2019, in the Korean Intellectual Property Office, the entire contents of which are hereby incorporated by reference.

BACKGROUND OF THE INVENTION

The present disclosure relates to a three-dimensional semiconductor memory device, and in particular, to a three-dimensional semiconductor memory device with improved electric characteristics.

Higher integration of semiconductor devices is required to satisfy consumer demands for superior performance and inexpensive prices. In the case of semiconductor devices, since their integration is an important factor in determining product prices, increased integration is especially beneficial. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

An embodiment of the inventive concept provides a three-dimensional semiconductor memory device with improved electric characteristics.

According to an embodiment of the inventive concept, a three-dimensional semiconductor memory device, including a first chip and a second chip stacked on the first chip may be provided. The first chip may include a first substrate including a first peripheral circuit region and a second peripheral circuit region, first contact plugs on the first peripheral circuit region of the first substrate, and second contact plugs on the second peripheral circuit region of the first substrate, and a first passive device on and electrically connected to the second contact plugs. The second chip may include a second substrate disposed on the first chip, the second substrate including a cell array region and a contact region, which vertically overlap the second peripheral circuit region and the first peripheral circuit region of the first chip, respectively. The second chip may further include gate electrodes stacked on the cell array region and the contact region of the second substrate and disposed between the first chip and the second substrate of the second chip, and cell contact plugs disposed on the contact region of the second substrate and on end portions of the gate electrodes and connected to the first contact plugs. The first passive device may be vertically between the gate electrodes and the second contact plugs and may include a first contact line.

According to an embodiment of the inventive concept, a three-dimensional semiconductor memory device, including a first substrate having a first peripheral circuit region and a second peripheral circuit region, first transistors on the first peripheral circuit region of the first substrate, first contact plugs connected to the first transistors, first contact lines on the first contact plugs, second transistors on the second peripheral circuit region of the first substrate, and second contact plugs connected to the second transistors. The three-dimensional semiconductor memory device may further include a second substrate disposed on the first contact lines, the second substrate comprising a first region and a second region, which vertically overlap the first peripheral circuit region and the second peripheral circuit region, respectively, gate electrodes stacked on the second region of the second substrate and between the second substrate and the second contact plugs, and cell contact plugs, which are disposed on the second region of the second substrate and on end portions of the gate electrodes and are connected to the second contact plugs. The first contact lines may be electrically disconnected from the second substrate.

According to an embodiment of the inventive concept, a three-dimensional semiconductor memory device, including a first substrate having a first peripheral circuit region and a second peripheral circuit region, first transistors on the first peripheral circuit region of the first substrate, an interlayered insulating layer covering the first transistors on the first substrate, and first contact plugs, which are provided to penetrate the interlayered insulating layer and are connected to the first transistors. The three-dimensional semiconductor memory device may further include first contact lines on the first contact plugs, a second substrate disposed on the interlayered insulating layer, the second substrate comprising a first region and a second region, which vertically overlap with the first peripheral circuit region and the second peripheral circuit region, respectively, gate electrodes, which are disposed between the second substrate and the interlayered insulating layer and are stacked on the second region of the second substrate, and vertical channel portions penetrating the gate electrodes. The adjacent contact lines of the first contact lines may constitute electrodes of a capacitor.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
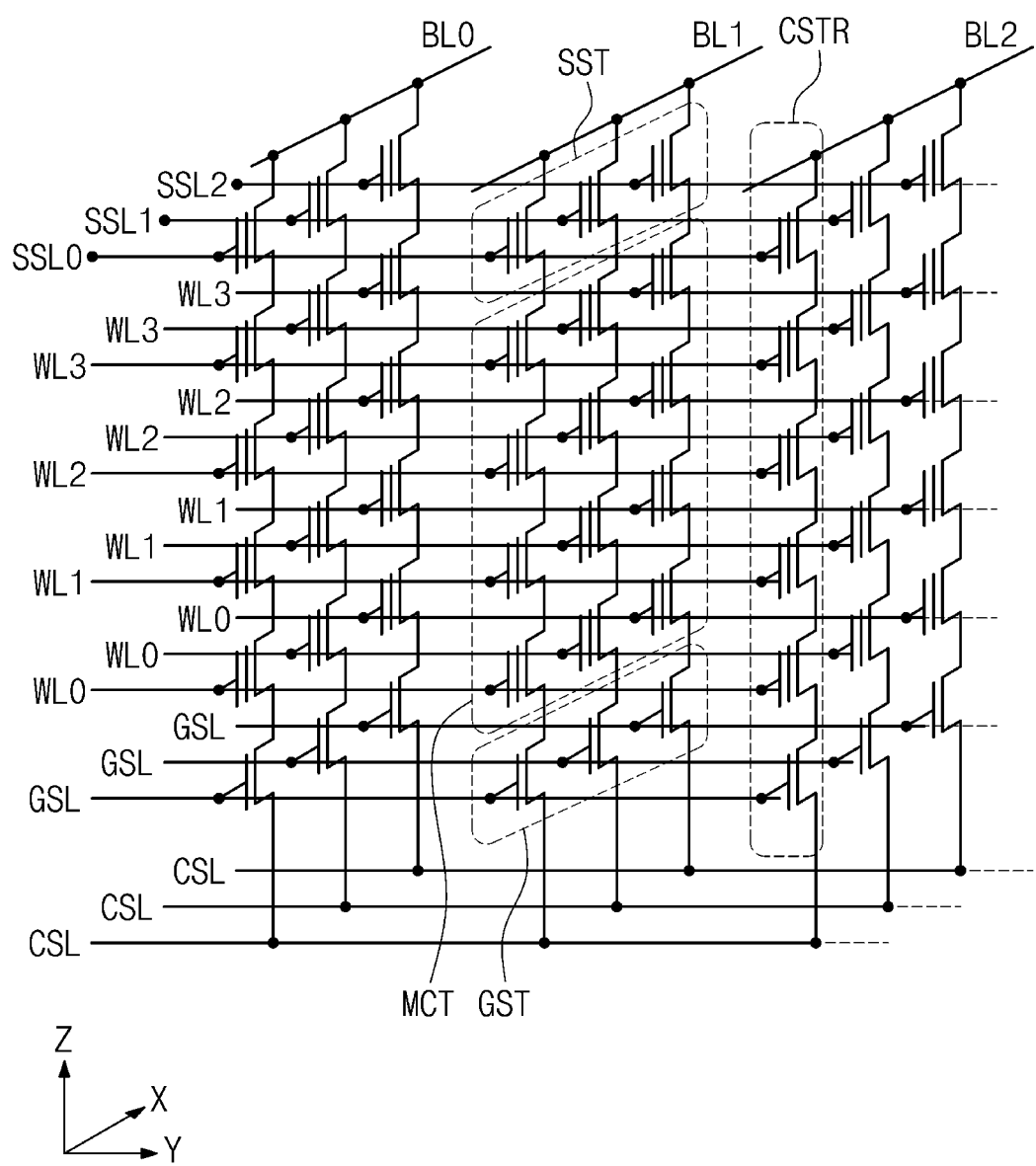
FIG. 1 is a circuit diagram schematically illustrating a cell array of a three-dimensional semiconductor memory device according to an embodiment of the inventive concept.

FIG. 1 is a circuit diagram schematically illustrating a cell array of a three-dimensional semiconductor memory device according to an embodiment of the inventive concept.

Referring to FIG. 1, a three-dimensional semiconductor memory device may include a common source line CSL, a plurality of bit lines BL0-BL2, and a plurality of cell strings CSTR, which are disposed between the common source line CSL and the bit lines BL0-BL2.

The common source line CSL may be a conductive thin film, which is disposed on a semiconductor substrate, or an impurity region, which is formed in the semiconductor substrate. The bit lines BL0-BL2 may be conductive patterns (e.g., metal lines), which are disposed on and spaced apart from the semiconductor substrate. The bit lines BL0-BL2 may be two-dimensionally arranged and a plurality of the cell strings CSTR may be connected in parallel to each of the bit lines BL0-BL2. Accordingly, the cell strings CSTR may be two-dimensionally arranged on the common source line CSL or the semiconductor substrate.

Each of the cell strings CSTR may be composed of a ground selection transistor GST coupled to the common source line CSL, a string selection transistor SST coupled to the bit lines BL0-BL2, and a plurality of memory cell transistors MCT disposed between the ground and string selection transistors GST and SST. The ground selection transistor GST, the string selection transistor SST, and the memory cell transistors MCT may be connected in series. Furthermore, a ground selection line GSL, a plurality of word lines WL0-WL3, and a plurality of string selection lines SSL0-SSL2, which are disposed between the common source line CSL and the bit lines BL0-BL2, may be respectively used as gate electrodes of the ground selection transistor GST, the memory cell transistors MCT, and the string selection transistors SST.

The ground selection transistors GST may be disposed at substantially the same height from the semiconductor substrate, and the gate electrodes thereof may be connected in common to the ground selection line GSL, thereby being in an equipotential state. To this end, the ground selection line GSL may be disposed between the common source line CSL and the lowermost ones of the memory cell transistors MCT adjacent thereto. Similarly, the gate electrodes of the memory cell transistors MCT, which are located at the same height from the common source line CSL, may be connected in common to one of the word lines WL0-WL3, thereby being in an equipotential state. Since each of the cell strings CSTR includes the memory cell transistors MCT disposed at different levels from the common source line CSL, the word lines WL0-WL3 may have a multi-layered structure between the common source line CSL and the bit lines BL0-BL2. Items described as "substantially the same," may be exactly the same, equal, or planar, or may be the same, equal, or planar within acceptable variations that may occur, for example, due to manufacturing processes.

The ground and string selection transistors GST and SST and the memory cell transistors MCT may be metal-oxide-semiconductor field effect transistors (MOSFETs) using channel structures as their channel regions.

Figure 2:
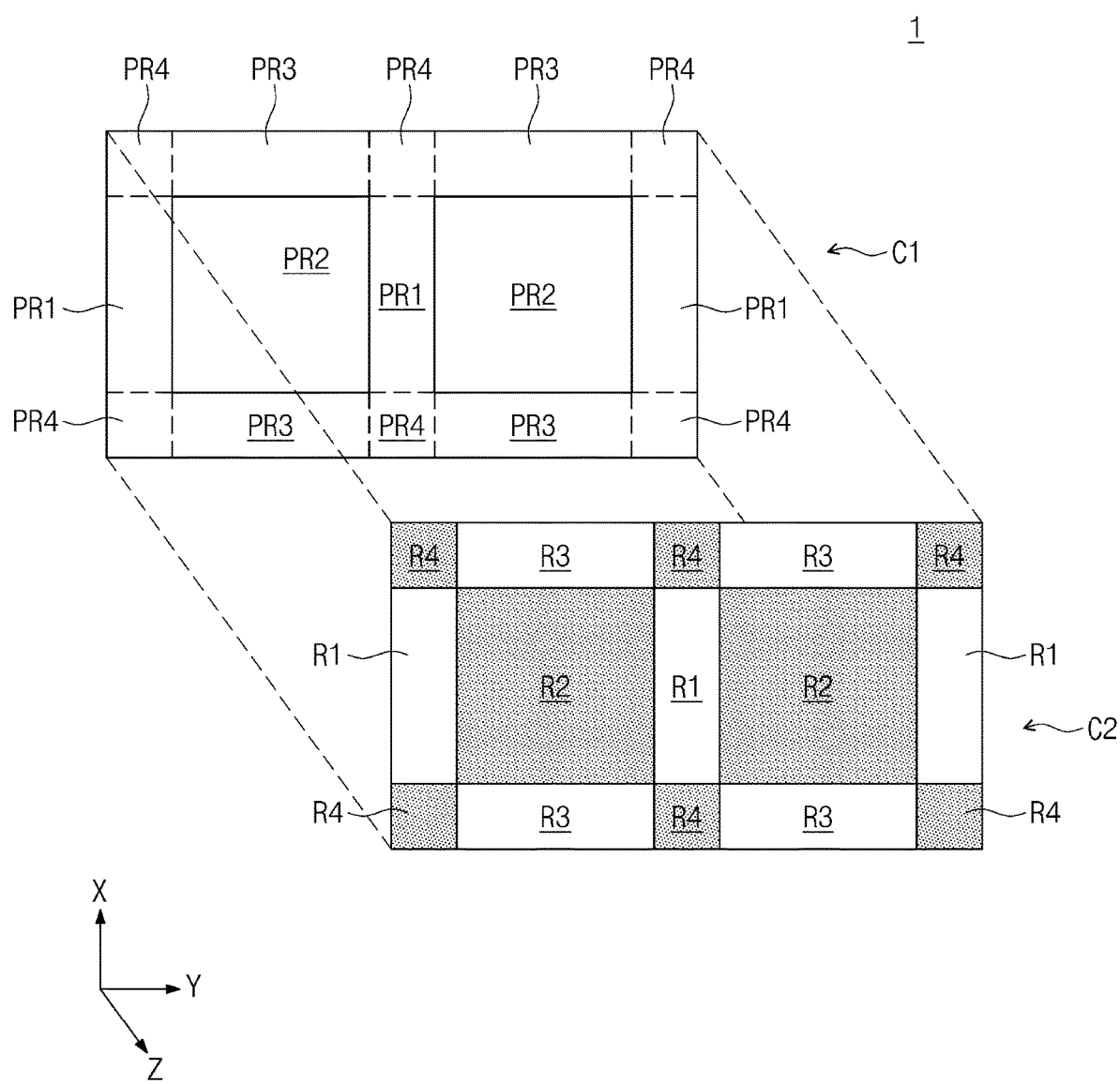
FIG. 2 is an isometric view illustrating a three-dimensional semiconductor memory device according to an embodiment of the inventive concept.
Figure 3:
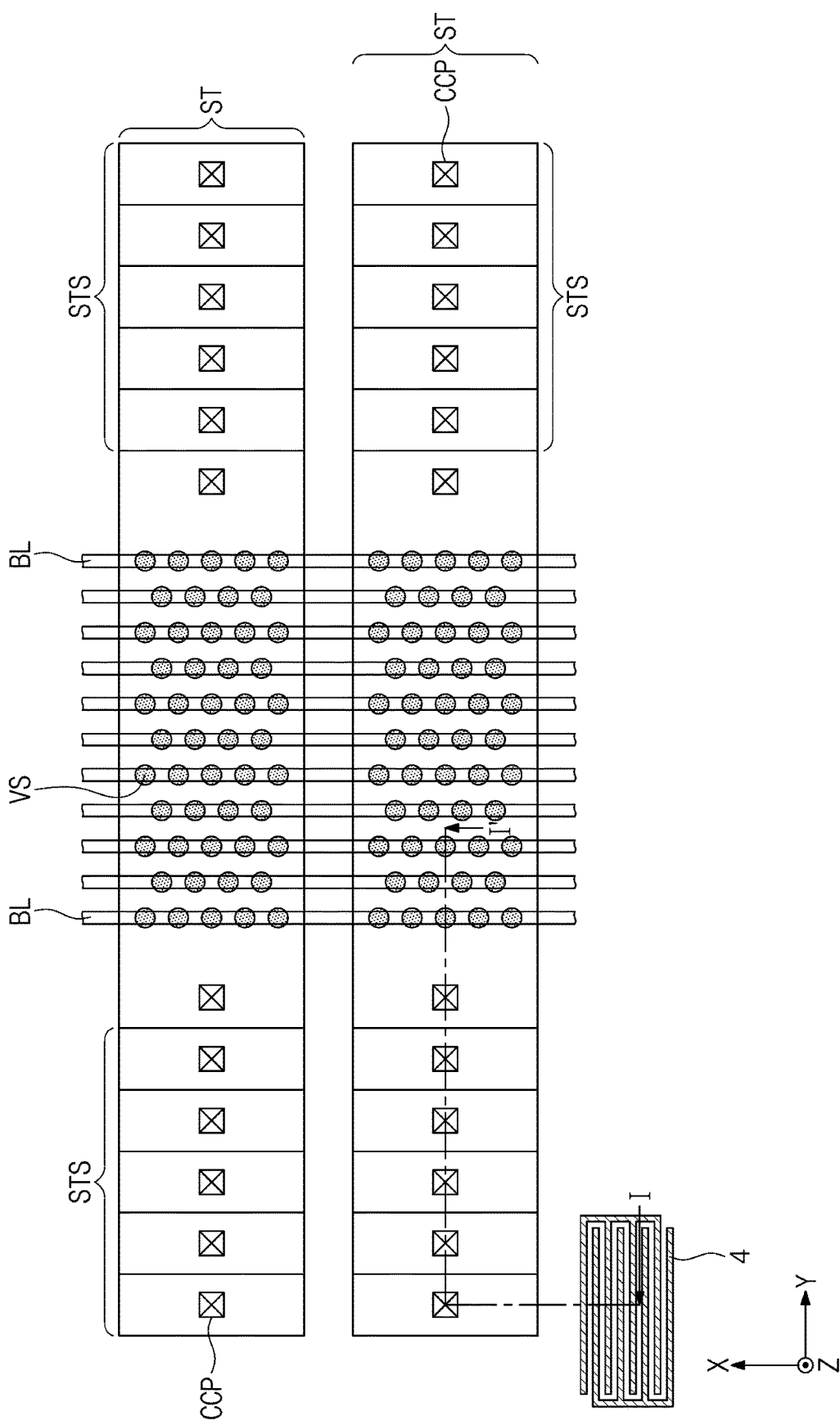
FIG. 3 is a plan view illustrating a three-dimensional semiconductor memory device according to an embodiment of the inventive concept.
Figure 4:
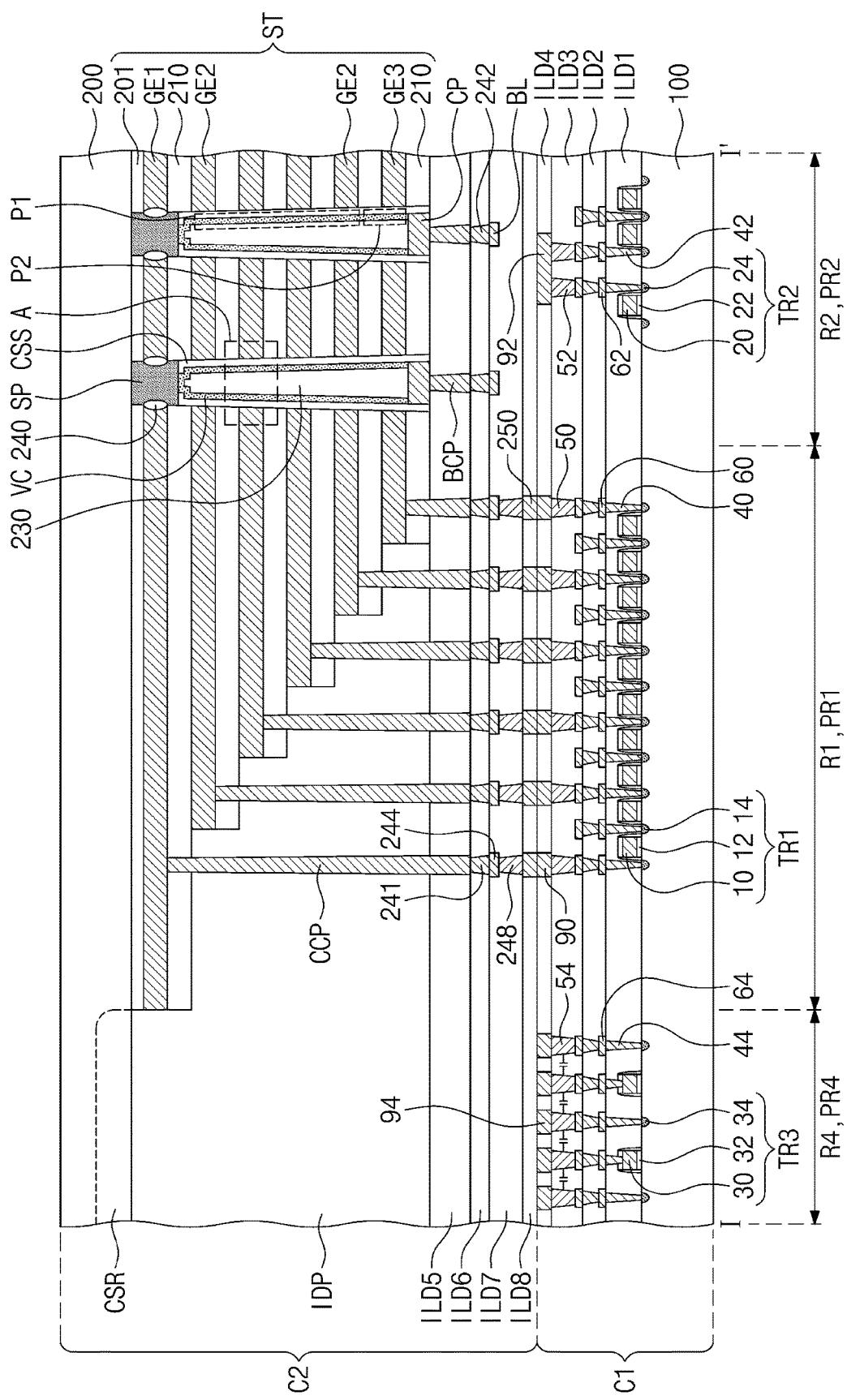
FIG. 4 is a sectional view taken along a line I-I' of FIG. 3 to illustrate a three-dimensional semiconductor memory device according to an embodiment of the inventive concept.
Figure 5:
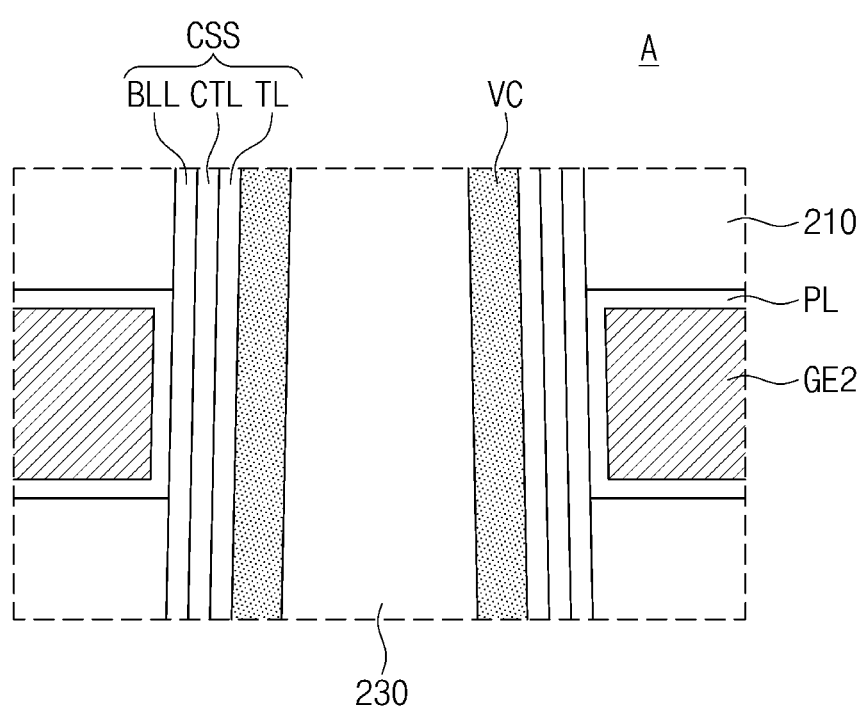
FIG. 5 is an enlarged sectional view of a portion 'A' of FIG. 4.
Figure 6A:
FIGS. 6A to 6C are plan views illustrating passive devices according to an embodiment of the inventive concept.
Figure 6B:
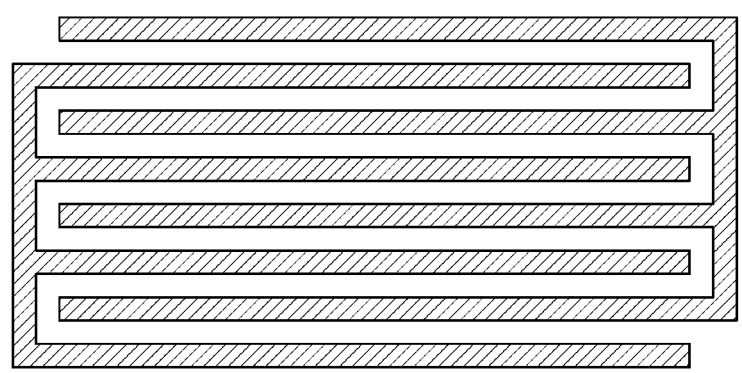
Figure 6C:
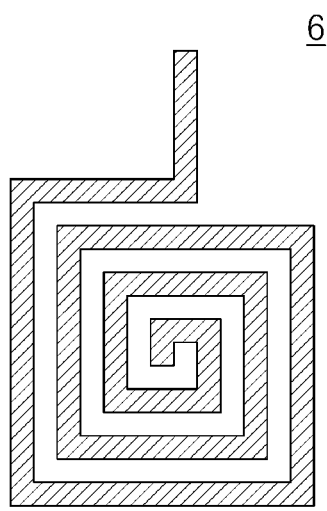

FIG. 2 is an isometric view illustrating a three-dimensional semiconductor memory device according to an embodiment of the inventive concept. FIG. 3 is a plan view illustrating a three-dimensional semiconductor memory device according to an embodiment of the inventive concept. FIG. 4 is a sectional view taken along a line I-I' of FIG. 3 to illustrate a three-dimensional semiconductor memory device according to an embodiment of the inventive concept. FIG. 5 is an enlarged sectional view of a portion 'A' of FIG. 4. FIGS. 6A to 6C are plan views illustrating passive devices according to an embodiment of the inventive concept. Ordinal numbers such as "first," "second," "third," etc. may be used simply as labels of certain elements to distinguish such elements from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Referring to FIGS. 2-4, a unit chip 1 including three-dimensional semiconductor memory devices may include a first chip C1 and a second chip C2. The second chip C2 may be vertically stacked on the first chip C1. The first chip C1 may include first peripheral circuit regions PR1, second peripheral circuit regions PR2, third peripheral circuit regions PR3, and fourth peripheral circuit regions PR4. The first peripheral circuit regions PR1 may be spaced apart from each other in a second direction Y. The second peripheral circuit regions PR2 may be disposed between the first peripheral circuit regions PR1. The third peripheral circuit regions PR3 may be spaced apart from each other, in a first direction X crossing the second direction Y, and the second peripheral circuit region PR2 may be interposed between the third peripheral circuit regions PR3. Each of the fourth peripheral circuit regions PR4 may be disposed between an adjacent first peripheral circuit regions PR1 and a sub-group of two adjacent third peripheral circuit regions PR3. For example, the fourth peripheral circuit regions PR4 may be respectively disposed near corners of the second peripheral circuit region PR2, when viewed in a plan view. The term "sub-group" shall be understood as having a number of kind of "at least one" unless clearly indicated otherwise.

The second chip C2 may include first regions R1, second regions R2, third regions R3, and fourth regions R4. The first peripheral circuit regions PR1 of the first chip C1 may be vertically overlapped with the first regions R1 of the second chip C2, the second peripheral circuit region PR2 of the first chip C1 may be vertically overlapped with the second region R2 of the second chip C2, and the third peripheral circuit regions PR3 of the first chip C1 may be vertically overlapped with the third regions R3 of the second chip C2. The fourth peripheral circuit regions PR4 of the first chip C1 may be vertically overlapped with the fourth regions R4 of the second chip C2.

The cell arrays may be disposed on the first regions R1, the second region R2, and the third regions R3 of the second chip C2. The second chip C2 may include stacks ST including gate electrodes GE1, GE2, and GE3 (e.g., see FIG. 4), vertical channel portions VC, cell contact plugs CCP, and bit lines BL. The cell contact plugs CCP, which are electrically connected to the gate electrodes GE1, GE2, and GE3, may be disposed on the first regions R1 of the second chip C2, and end portions of the bit lines BL may be disposed on the third regions R3 of the second chip C2. The vertical channel portions VC may be disposed on the second region R2 of the second chip C2. The cell arrays may not be disposed on the fourth regions R4 of the second chip C2.

Referring to FIGS. 3 and 4, active devices such as first transistors TR1 may be disposed on the first peripheral circuit regions PR1 and the third peripheral circuit region PR3 of the first chip C1. The first transistors TR1 may be transistors, which are used to operate the cell arrays. The first transistors TR1 may not be disposed on the fourth peripheral circuit regions PR4 and/or the second peripheral circuit region PR2 of the first chip C1. Second transistors TR2 may be disposed on the second peripheral circuit region PR2 of the first chip C1. The second transistors TR2 may be transistors, which are used to operate a passive device. Third transistors TR3 may be disposed on the fourth peripheral circuit regions PR4 of the first chip C1. The third transistors TR3 may be transistors, which are used to operate the passive device. A "passive device" may be a component that is incapable of controlling electrical current by means of another electrical signal. Exemplary passive devices may include, resistors, capacitors, inductors, and transformers. Additional aspects of an exemplary "passive device" will be described in more detail below.

The first chip C1 may further include a first substrate 100, first to third contact plugs 40, 42, and 44, first to third vias 50, 52, and 54, first to third pads 60, 62, and 64, and first to third contact lines 90, 92, and 94, in addition to the first transistors TR1, the second transistors TR2, and the third transistors TR3.

The first substrate 100 may include the first to fourth peripheral circuit regions PR1, PR2, PR3, and PR4. The first substrate 100 may be a silicon wafer, a silicon-germanium wafer, a germanium wafer, or a single-crystalline silicon wafer and a single crystalline epitaxial layer grown therefrom. The first transistors TR1 may be disposed on the first peripheral circuit region PR1 of the first substrate 100. Each of the first transistors TR1 may include a first peripheral gate electrode 10, a first gate insulating layer 12, and first source/drain regions 14. The first peripheral gate electrode 10 may be disposed on the first peripheral circuit region PR1 of the first substrate 100. The first gate insulating layer 12 may be disposed between the first peripheral gate electrode 10 and the first substrate 100. The first source/drain regions 14 may be disposed in portions of the first substrate 100, which are located at both sides of the first peripheral gate electrode 10.

The second transistors TR2 may be disposed on the second peripheral circuit region PR2 of the first substrate 100. Each of the second transistors TR2 may include a second peripheral gate electrode 20, a second gate insulating layer 22, and second source/drain regions 24. The second peripheral gate electrode 20 may be disposed on the second peripheral circuit region PR2 of the first substrate 100. The second gate insulating layer 22 may be disposed between the second peripheral gate electrode 20 and the first substrate 100. The second source/drain regions 24 may be disposed in portions of the first substrate 100, which are located at both sides of the second peripheral gate electrode 20.

The third transistors TR3 may be disposed on the fourth peripheral circuit region PR4 of the first substrate 100. Each of the third transistors TR3 may include a third peripheral gate electrode 30, a third gate insulating layer 32, and third source/drain regions 34. The third peripheral gate electrode 30 may be disposed on the fourth peripheral circuit region PR4 of the first substrate 100. The third gate insulating layer 32 may be disposed between the third peripheral gate electrode 30 and the first substrate 100. The third source/drain regions 34 may be disposed in portions of the first substrate 100, which are located at both sides of the third peripheral gate electrode 30.

The first to third peripheral gate electrodes 10, 20, and 30 may be formed of or include at least one metallic material (e.g., tungsten and aluminum). The first to third gate insulating layers 12, 22, and 32 may include, for example, a thermal oxide layer or a high-k dielectric layer. In an embodiment, the first to third source/drain regions 14, 24, and 34 may have a conductivity type different from that of the first substrate 100.

A first interlayered insulating layer ILD1 may be disposed on the first substrate 100. The first interlayered insulating layer ILD1 may cover the first to third transistors TR1, TR2, and TR3. The first interlayered insulating layer ILD1 may include, for example, a silicon oxide layer. The first contact plugs 40 may be disposed on the first peripheral circuit region PR1 of the first substrate 100. The first contact plugs 40 may be provided to penetrate the first interlayered insulating layer ILD1 and may be electrically connected to the first source/drain regions 14. The second contact plugs 42 may be disposed on the second peripheral circuit region PR2 of the first substrate 100. Each of the second contact plugs 42 may be provided to penetrate the first interlayered insulating layer ILD1 and may be electrically connected to one of the second source/drain regions 24 and the second peripheral gate electrodes 20. The third contact plugs 44 may be disposed on the fourth peripheral circuit region PR4 of the first substrate 100. Each of the third contact plugs 44 may be provided to penetrate the first interlayered insulating layer ILD1 and may be electrically connected to one of the third source/drain regions 34 and the third peripheral gate electrodes 30. Each of the first to third contact plugs 40, 42, and 44 may be formed of or include at least one metallic material (e.g., copper, tungsten, and aluminum) or metal nitride (titanium nitride, tungsten nitride, and aluminum nitride).

A second interlayered insulating layer ILD2 and a third interlayered insulating layer ILD3 may be sequentially stacked on the first interlayered insulating layer ILD1. The second and third interlayered insulating layers ILD2 and ILLD3 may be formed of or include at least one insulating material (e.g., silicon oxide).

The first vias 50 may be disposed on the first contact plugs 40. The first vias 50 may be provided to penetrate the second interlayered insulating layer ILD2 and the third interlayered insulating layer ILD3. The first vias 50 may be formed of or include at least one metallic material (e.g., tungsten and copper). The first pads 60 may be disposed between first vias 50, which are adjacent to each other in a direction (e.g., a third direction Z) normal to a top surface of the first substrate 100. The first pads 60 may electrically connect first vias 50, which are adjacent to each other in the third direction Z, to each other. The lowermost sub-group of the first pads 60 may be disposed between the first contact plugs 40 and the lowermost sub-group of the first vias 50. The lowermost sub-group of the first pads 60 may connect the first contact plugs 40 to the lowermost sub-group of the first vias 50. The first vias 50 and the first pads 60 may be formed of or include at least one metallic material (e.g., tungsten and copper).

The second vias 52 may be disposed on the second contact plugs 42. The second vias 52 may be provided to penetrate the second interlayered insulating layer ILD2 and the third interlayered insulating layer ILD3. The second vias 52 may be formed of or include at least one metallic material (e.g., tungsten and copper). The second pads 62 may be disposed between the second vias 52, which are adjacent to each other in the direction (e.g., the third direction Z) normal to the top surface of the first substrate 100. The second pads 62 may electrically connect the second vias 52, which are adjacent to each other in the third direction Z, to each other. The lowermost sub-group of the second pads 62 may be disposed between the second contact plugs 42 and the lowermost sub-group of the second vias 52. The lowermost sub-group of the second pads 62 may connect the second contact plugs 42 to the lowermost sub-group of the second vias 52. The second vias 52 and the second pads 62 may be formed of or include at least one metallic material (e.g., tungsten and copper).

The third vias 54 may be disposed on the third contact plugs 44. The third vias 54 may be provided to penetrate the second interlayered insulating layer ILD2 and the third interlayered insulating layer ILD3. The third vias 54 may be formed of or include at least one metallic material (e.g., tungsten and copper). The third pads 64 may be disposed between the third vias 54, which are adjacent to each other in the direction (e.g., the third direction Z) normal to the top surface of the first substrate 100. The third pads 64 may electrically connect the third vias 54, which are adjacent to each other in the third direction Z, to each other. The lowermost sub-group of the third pads 64 may be disposed between the third contact plugs 44 and the lowermost sub-group of the third vias 54. The lowermost sub-group of the third pads 64 may connect the third contact plugs 44 to the lowermost sub-group of the third vias 54. The third vias 54 and the third pads 64 may be formed of or include at least one of metallic materials (e.g., tungsten and copper).

A fourth interlayered insulating layer ILD4 may be disposed on the third interlayered insulating layer ILD3. The fourth interlayered insulating layer ILD4 may cover a top surface of the third interlayered insulating layer ILD3 and top surfaces of the uppermost sub-group of the first to third vias 50, 52, and 54. The fourth interlayered insulating layer ILD4 may be formed of or include at least one of insulating materials (e.g., silicon oxide).

The first contact lines 90 may be disposed on the first contact plugs 40. The first contact lines 90 may be disposed in the fourth interlayered insulating layer ILD4 and on the uppermost sub-group of the first vias 50 and may be in contact with the first vias 50. It will be understood that when an element is referred to as being "in contact' with another element, it can be directly contacting the other element or intervening elements may be present. In contrast, when an element is referred to as being "in direct contact" with another element, there are no intervening elements present. The first contact lines 90 may be electrically connected to the first contact plugs 40 through the first vias 50 and the first pads 60. The first contact lines 90 may be electrically connected to the first transistors TR1 through the first contact plugs 40. The first contact lines 90 may be formed of and/or include at least one metallic material (e.g., tungsten and copper).

The second contact line 92 may be disposed on the second contact plugs 42. The second contact line 92 may be disposed in the fourth interlayered insulating layer ILD4 and on the uppermost sub-group of the second vias 52 and may be in contact with the second vias 52. The second contact line 92 may be electrically connected to the second contact plugs 42 through the second vias 52 and the second pads 62. The second contact line 92 may be electrically connected to the second transistors TR2 through the second contact plugs 42. The second contact line 92 may be electrically disconnected from the second chip C2. For example, the second contact line 92 may be electrically disconnected from a second substrate 200 of the second chip C2. The second contact line 92 may be formed of or include at least one metallic material (e.g., tungsten and copper).

In an embodiment, the second contact line 92 may constitute a passive device. Referring to FIGS. 6A to 6C, the passive device may correspond to, for example, a resistor 2, a capacitor 4, or an inductor 6. In the case where the second contact line 92 is the resistor 2 or the inductor 6, the second contact line 92 may be provided as a single object, as shown in FIGS. 6A and 6C. The single object may be a continuous line, for example, having a shape, such as a zig-zag shape or spiral shape, for which in a cross-sectional view, a plurality of line segments are sequentially arranged with spaces therebetween. Although not illustrated in the drawings, in the case where the second contact line 92 is a part of a capacitor 4, a plurality of the second contact lines 92, for example two continuously formed conductors, may be provided to include line segments horizontally spaced apart from each other, in a cross-sectional view. Two segments of the second contact lines 92, which are horizontally adjacent to each other, may constitute electrodes of the capacitor 4, and the fourth interlayered insulating layer ILD4 between segments of the second contact lines 92 may constitute a dielectric layer of the capacitor 4. Each electrode of the capacitor may have a shape like prongs of a fork, or may have a shape including a stem with branches extending therefrom. Each electrode may be a single object, which may be a continuously formed conductor, for example, having a shape, for which in a cross-sectional view, a plurality of line segments are sequentially arranged with spaces therebetween. In the case where the second contact lines 92 constitute the electrodes of the capacitor 4, the uppermost horizontally adjacent sub-group of the second vias 52, which are disposed below the second contact lines 92, may also constitute the electrodes of the capacitor 4. In addition, the third interlayered insulating layer ILD3 between the uppermost horizontally adjacent sub-group of the second vias 52 may constitute the dielectric layer of the capacitor 4.

The third contact lines 94 may be disposed on the third contact plugs 44. The third contact lines 94 may be disposed in the fourth interlayered insulating layer ILD4 and on the uppermost sub-group of the third vias 54 and may be in contact with the third vias 54. The third contact lines 94 may be electrically connected to the third contact plugs 44 through the third vias 54 and the third pads 64. The third contact lines 94 may be electrically connected to the third transistors TR3 through the third contact plugs 44. The third contact lines 94 may be electrically disconnected from the second chip C2. For example, the third contact lines 94 may be electrically disconnected from the second substrate 200 of the second chip C2. The third contact lines 94 may have surfaces that are coplanar with surfaces of the first contact lines 90 and surfaces of the second contact lines 92. The third contact lines 94 may be formed of or include at least one metallic material (e.g., tungsten and copper).

In an embodiment, the third contact lines 94 may constitute a passive device. Referring to FIGS. 6A to 6C, the passive device may correspond to, for example, the resistor 2, the capacitor 4, or the inductor 6. In the case where the third contact lines 94 are parts of the capacitor 4, the third contact lines 94 may be horizontally spaced apart from each other, as shown in FIG. 6B. The third contact lines 94, which are horizontally adjacent to each other, may constitute the electrodes of the capacitor 4, and the fourth interlayered insulating layer ILD4 between the third contact lines 94 may constitute the dielectric layer of the capacitor 4. In the case where the third contact lines 94 constitute the electrodes of the capacitor 4, the uppermost horizontally adjacent sub-group of the third vias 54, which are disposed below the third contact lines 94, may also constitute the electrodes of the capacitor 4. In addition, the third interlayered insulating layer ILD3 between the uppermost horizontally adjacent sub-group of the third vias 54 may constitute the dielectric layer of the capacitor 4. Although not illustrated in the drawings, in the case where the third contact lines 94 are the resistor 2 or the inductor 6, the third contact lines 94 may be provided as a single object.

The second chip C2, which is disposed on the first chip C1, may include the second substrate 200, the stacks ST, the vertical channel portions VC, a charge storing structure CSS, the cell contact plugs CCP, and the bit lines BL.

The second substrate 200 may be disposed on the fourth interlayered insulating layer ILD4. It will be understood that when an element is referred to as being "on" another element, it can be directly on the other element or intervening elements may be present. The second substrate 200 may include the first regions R1, the second region R2, the third regions R3, and the fourth regions R4. The second region R2 of the second substrate 200 may be a cell array region. The first regions R1 of the second substrate 200 may be a contact region, on which the cell contact plugs CCP are disposed. The third regions R3 of the second substrate 200 may be a contact region, on which end portions of the bit lines BL are disposed. The fourth regions R4 of the second substrate 200 may be an outer region, on which the stacks ST are exposed. The second substrate 200 may be a silicon wafer, a silicon-germanium wafer, a germanium wafer, or a single-crystalline silicon wafer and a single crystalline epitaxial layer grown therefrom, for example.

The stacks ST may be disposed between the first regions R1 of the second substrate 200 and the fourth interlayered insulating layer ILD4 and between the second region R2 of the second substrate 200 and the fourth interlayered insulating layer ILD4. The stacks ST may be spaced apart from each other in the first direction X and may be extended in the second direction Y. Each of the stacks ST may include a buffer insulating layer 201, the gate electrodes GE1, GE2, and GE3, and insulating patterns 210.

Hereinafter, features in the third direction Z of the first and second chips C1 and C2 will be described in an opposite (i.e., inverted) manner, for convenience in description. The gate electrodes GE1, GE2, and GE3 may be stacked on the first regions R1 and the second regions R2 of the second substrate 200. The gate electrodes GE1, GE2, and GE3 may include a ground selection gate electrode GE1, a string selection gate electrode GE3, and cell gate electrodes GE2 between the ground selection gate electrode GE1 and the string selection gate electrode GE3. Lengths of the gate electrodes GE1, GE2, and GE3 in the second direction Y may decrease with increasing distance from the second substrate 200. For example, among the gate electrodes GE1, GE2, and GE3, the length of the ground selection gate electrode GE1 in the second direction Y may be longest, and the length of the string selection gate electrode GE3 in the second direction Y may be shortest. The gate electrodes GE1, GE2, and GE3 may have end portions, on the first regions R1 of the second substrate 200. The gate electrodes GE1, GE2, and GE3 may be formed of or include at least one metallic material (e.g., tungsten) or metal nitrides (e.g., tungsten nitride, titanium nitride, and tantalum nitride). The buffer insulating layer 201 may be disposed between the second substrate 200 and the ground selection gate electrode GE1. The buffer insulating layer 201 may include, for example, a thermal oxide layer.

The insulating patterns 210 may be disposed between he gate electrodes GE1, GE2, and GE3, which are adjacent to each other in the third direction Z. The uppermost one of the insulating patterns 210 may be disposed on the string selection gate electrode GE3. Lengths of the insulating patterns 210 in the second direction Y may decrease with increasing distance from the second substrate 200. For example, the length of each of the insulating patterns 210 in the second direction Y may be substantially equal to a length, in the second direction Y, of the gate electrode adjacent to the second substrate 200, between the gate electrodes GE1, GE2, and GE3 adjacent to each other in the third direction Z. The length of the uppermost one of the insulating patterns 210 in the second direction Y may be substantially equal to the length of the string selection gate electrode GE3 in the second direction Y. The insulating patterns 210 may be formed of or include, for example, silicon oxide.

The vertical channel portions VC may be disposed on the second region R2 of the second substrate 200. The vertical channel portions VC may be disposed in the stack ST. For example, the vertical channel portions VC may be provided to penetrate the cell gate electrodes GE2, the string selection gate electrode GE3, and the insulating patterns 210, except for the insulating patterns 210 closest to and farthest from the second substrate 200. Widths of the vertical channel portions VC may increase with increasing distance from the second substrate 200. The vertical channel portions VC may be arranged to form a zigzag shape, in the second direction Y. Sidewalls of the vertical channel portions VC may be flat. Each of the vertical channel portions VC may include a first portion P1 penetrating the cell gate electrodes GE2 and a second portion P2 penetrating the string selection gate electrode GE3. In some embodiments, the first portion P1 constitutes a relatively larger portion of the vertical channel portions VC than the second portion P2. Additionally, the first portion P1 may be disposed above the second portion P2. A sidewall of the first portion P1 and a sidewall of the second portion P2 may be inclined but may be aligned to each other. For example, a first sidewall of the first portion P1 and a second sidewall of the second portion P2 may each be inclined by the same amount or degree and therefore be aligned. Each of the vertical channel portions VC may include a single layer or a plurality of layers. The vertical channel portions VC may be formed of or include at least one of, for example, single crystalline silicon, organic semiconductor materials, and carbon nano structures.

Semiconductor pillars SP may be disposed between the vertical channel portions VC and the second substrate 200. The semiconductor pillars SP may be disposed on a top surface of the second substrate 200 and may penetrate the ground selection gate electrode GE1. The semiconductor pillars SP and the vertical channel portions VC may be in contact with each other. The semiconductor pillars SP may be formed of or include a doped semiconductor material, whose conductivity type is the same as the second substrate 200, or an intrinsic semiconductor material.

The charge storing structures CSS may be disposed between the vertical channel portions VC and the cell and string selection gate electrodes GE2 and GE3. The charge storing structures CSS may be extended along outer sidewalls of the vertical channel portions VC and in the third direction Z. For example, the charge storing structures CSS may have a shape surrounding the outer sidewalls of the vertical channel portions VC. The charge storing structures CSS may include at least one of, for example, a silicon oxide layer, a silicon nitride layer, a silicon oxynitride layer, and high-k dielectric layers and may have a single or multi-layered structure.

As shown in FIG. 5, each of the charge storing structures CSS may include a tunnel insulating layer TL, a blocking insulating layer BLL, and a charge storing layer CTL. The tunnel insulating layer TL may be disposed adjacent to each of the vertical channel portions VC and may enclose the outer sidewall of the vertical channel portion VC. The blocking insulating layer BLL may be disposed adjacent to the cell and string selection gate electrodes GE2 and GE3. The charge storing layer CTL may be disposed between the tunnel insulating layer TL and the blocking insulating layer BLL. The tunnel insulating layer TL may be formed of or include at least one of, for example, silicon oxide or high-k dielectric materials (e.g., aluminum oxide ($Al_2O_3$) and hafnium oxide ($HfO_2$)). The blocking insulating layer BLL may be formed of or include at least one of, for example, silicon oxide or high-k dielectric materials (e.g., aluminum oxide ($Al_2O_3$) and hafnium oxide ($HfO_2$)). The charge storing layer CTL may be formed of or include, for example, silicon nitride.

Gap-fill layers 230 may be disposed in internal spaces of the vertical channel portions VC. The gap-fill layers 230 may be formed of or include at least one of, for example, silicon oxide, silicon nitride, or silicon oxynitride. Channel pads CP may be disposed on top surfaces of the vertical channel portions VC and the charge storing structures CSS. The channel pads CP may be formed of or include at least one of conductive materials and semiconductor materials, which are doped to have a different conductivity type from the vertical channel portions VC. A gate insulating pattern 240 may be disposed between each of the semiconductor pillars SP and the ground selection gate electrode GE1. The gate insulating pattern 240 may have side surfaces, which are convexly curved in opposite directions. The gate insulating pattern 240 may include, for example, a thermal oxide layer.

A horizontal insulating layer PL may be disposed between the charge storing structure CSS and the cell gate electrodes GE2 and between the charge storing structure CSS and the string selection gate electrode GE3. The horizontal insulating layer PL may be extended to cover top and bottom surfaces of the cell gate electrodes GE2 and top and bottom surfaces of the string selection gate electrode GE3. The horizontal insulating layer PL may be formed of or include at least one of high-k dielectric materials (e.g., aluminum oxide ($Al_2O_3$) and hafnium oxide ($HfO_2$)).

A common source region CSR may be disposed in the second substrate 200 between the stacks ST. The common source region CSR may have a different conductivity type from the second substrate 200. The common source region CSR may be extended into the fourth regions R4 of the second substrate 200. The stacks ST may be provided to expose the common source region CSR.

An interlayered insulating pattern IDP may be disposed on the first regions R1 and the fourth regions R4 of the second substrate 200. The interlayered insulating pattern IDP may cover staircase structures STS of the stacks ST, which are disposed on the first regions R1 of the second substrate 200, and top surfaces of the fourth regions R4 of the second substrate 200. The interlayered insulating pattern IDP may be formed of or include, for example, silicon oxide. A fifth interlayered insulating layer ILD5 may be disposed on the stacks ST and the interlayered insulating pattern IDP. The fifth interlayered insulating layer ILD5 may be formed of or include, for example, silicon oxide.

The cell contact plugs CCP may be disposed on the first regions R1 of the second substrate 200. The cell contact plugs CCP may be disposed on end portions of the gate electrodes GE1, GE2, and GE3, each of which is extended onto the first regions R1 of the second substrate 200. The cell contact plugs CCP may be provided to penetrate the fifth interlayered insulating layer ILD5 and the interlayered insulating pattern IDP and may be in contact with the end portions of the gate electrodes GE1, GE2, and GE3. The cell contact plugs CCP may be electrically connected to the gate electrodes GE1, GE2, and GE3. The cell contact plugs CCP may be formed of or include at least one metallic material (e.g., tungsten, copper, and aluminum) or metal nitride (e.g., tungsten nitride, tantalum nitride, titanium nitride, and aluminum nitride).

Bit line contact plugs BCP may be disposed on the second region R2 of the second substrate 200. The bit line contact plugs BCP may be provided to penetrate the fifth interlayered insulating layer ILD5 and may be disposed on the channel pads CP. The bit line contact plugs BCP may be electrically connected to the vertical channel portions VC. The bit line contact plugs BCP may be formed of or include at least one metallic material (e.g., tungsten, copper, and aluminum) or metal nitride (e.g., tungsten nitride, tantalum nitride, titanium nitride, and aluminum nitride).

A sixth interlayered insulating layer ILD6 may be disposed on the fifth interlayered insulating layer ILD5. The sixth interlayered insulating layer ILD6 may be formed of or include, for example, silicon oxide. Fourth vias 241 may be disposed on the cell contact plugs CCP. The fourth vias 241 may be provided to penetrate the sixth interlayered insulating layer ILD6 and to be in contact with the cell contact plugs CCP. Fifth vias 242 may be disposed on the bit line contact plugs BCP. The fifth vias 242 may be provided to pass through the sixth interlayered insulating layer ILD6 and to be in contact with the bit line contact plugs BCP. The fourth and fifth vias 241 and 242 may be formed of or include at least one metallic material (e.g., tungsten, copper, and aluminum).

Fourth pads 244 may be disposed on the sixth interlayered insulating layer ILD6. The fourth pads 244 may be in contact with surfaces of the fourth vias 241. The bit lines BL may be disposed on the sixth interlayered insulating layer ILD6. The bit lines BL may be in contact with surfaces of the fifth vias 242. The bit lines BL may be electrically connected to the vertical channel portions VC. The bit lines BL may be extended in the first direction X and may be spaced apart from each other in the second direction Y crossing the first direction X. The fourth pads 244 and the bit lines BL may be formed of or include at least one metallic material (e.g., tungsten, copper, and aluminum). A seventh interlayered insulating layer ILD7 may be disposed on the sixth interlayered insulating layer ILD6. The seventh interlayered insulating layer ILD7 may cover the fourth pads 244 and the bit lines BL. The seventh interlayered insulating layer ILD7 may include a silicon oxide layer. Sixth vias 248 may be disposed in the seventh interlayered insulating layer ILD7. The sixth vias 248 may be in contact with the fourth pads 244. The sixth vias 248 may be formed of or include at least one metallic material (e.g., tungsten, copper, and aluminum).

An eighth interlayered insulating layer ILD8 may be disposed on the seventh interlayered insulating layer ILD7. The eighth interlayered insulating layer ILD8 may cover surfaces of the sixth vias 248. The eighth interlayered insulating layer ILD8 may include, for example, a silicon oxide layer. Fourth contact lines 250 may be disposed in the eighth interlayered insulating layer ILD8. The fourth contact lines 250 may be in contact with the sixth vias 248 and may be electrically connected to the sixth vias 248. The fourth contact lines 250 may be disposed to correspond to the first contact lines 90 and to be in contact with the first contact lines 90. For example, the first contact lines 90 and the fourth contact lines 250 may be used as bonding pads connecting the first and second chips C1 and C2 to each other.

In an embodiment, the gate electrodes GE1, GE2, and GE3 may be electrically connected to the first transistors TR1. The first transistors TR1 may apply a voltage to the gate electrodes GE1, GE2, and GE3. The first transistors TR1 may be electrically connected to the second chip C2 and the second and third transistors TR2 and TR3 may be electrically disconnected from the second chip C2.

According to an embodiment of the inventive concept, the passive devices may be provided on the second to third peripheral circuit regions PR2 and PR3, of the first chip C1, in which the bonding pads electrically connecting the transistors of the first chip C1 to the cell arrays of the second chip C2 are not provided. For example, there are no bonding pads in the second to third peripheral circuit regions PR2 and PR3 and passive devices are provided in at least one of the second to third peripheral circuit regions PR2 and PR3. Accordingly, it may be possible to improve operational characteristics of a three-dimensional semiconductor memory device, and it may be possible to reduce a chip size, because the passive device is disposed on a region that has not been used so far.

Figure 7:
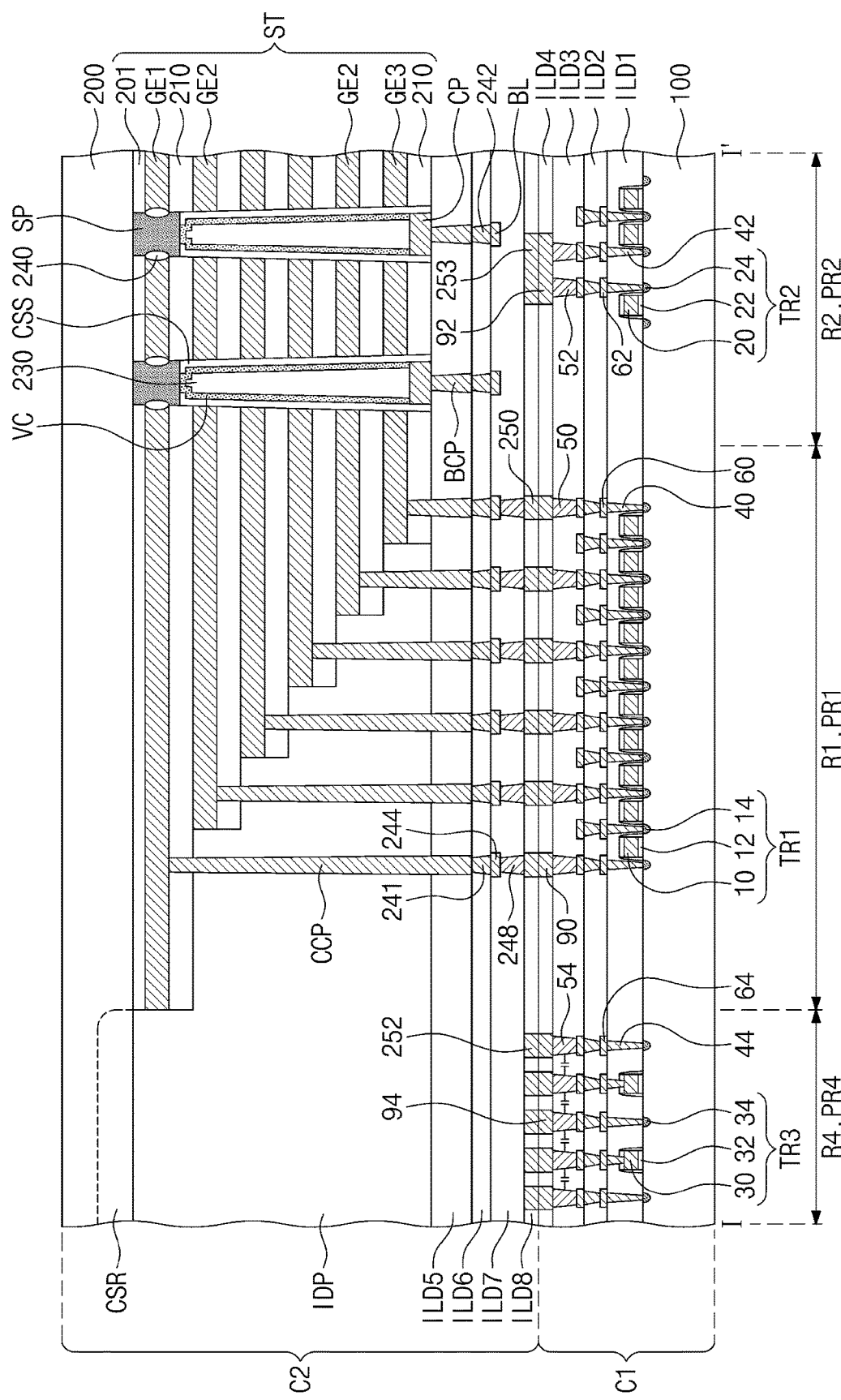
FIG. 7 is a sectional view taken along a line I-I' of FIG. 3 to illustrate a three-dimensional semiconductor memory device according to an embodiment of the inventive concept.

FIG. 7 is a sectional view taken along a line I-I' of FIG. 3 to illustrate a three-dimensional semiconductor memory device according to an embodiment of the inventive concept.

Referring to FIG. 7, the second chip C2 may include fifth contact lines 252 and sixth contact lines 253. The fifth contact lines 252 may be disposed in the eighth insulating layer ILD8, may be in contact with the third contact lines 94, and may be electrically connected to the third transistors TR3. Surfaces of the fifth contact lines 252 may be coplanar with surfaces of the fourth contact lines 250, which are in direct contact with the first contact lines 90. The fifth contact lines 252 may be electrically disconnected from the second substrate 200 and/or the common source region CSR. For example, the fifth contact lines 252 may be electrically disconnected from other conductive elements of the second chip C2.

The sixth contact lines 253 may be disposed in the eighth interlayered insulating layer ILD8, may be in contact with the second contact lines 92, and may be electrically connected to the second transistors TR2. Surfaces of the sixth contact lines 253 may be coplanar with surfaces of the fourth contact lines 250, which are in direct contact with the first contact lines 90. The sixth contact lines 253 may be electrically disconnected from the second substrate 200 and/or the common source region CSR. For example, the sixth contact lines 253 may be electrically disconnected from other conductive elements of the second chip C2.

According to an embodiment of the inventive concept, by providing the fifth contact lines 252 on the third contact lines 94 constituting a passive device, or by providing the sixth contact lines 253 on the second contact lines 92 constituting a passive device, it may be possible to increase a vertical thickness (i.e., in the third direction Z) of the passive device. Accordingly, by adjusting resistance and capacitance of the passive device, it may be possible to improve electrical characteristics of a three-dimensional semiconductor memory device.

Figure 8:
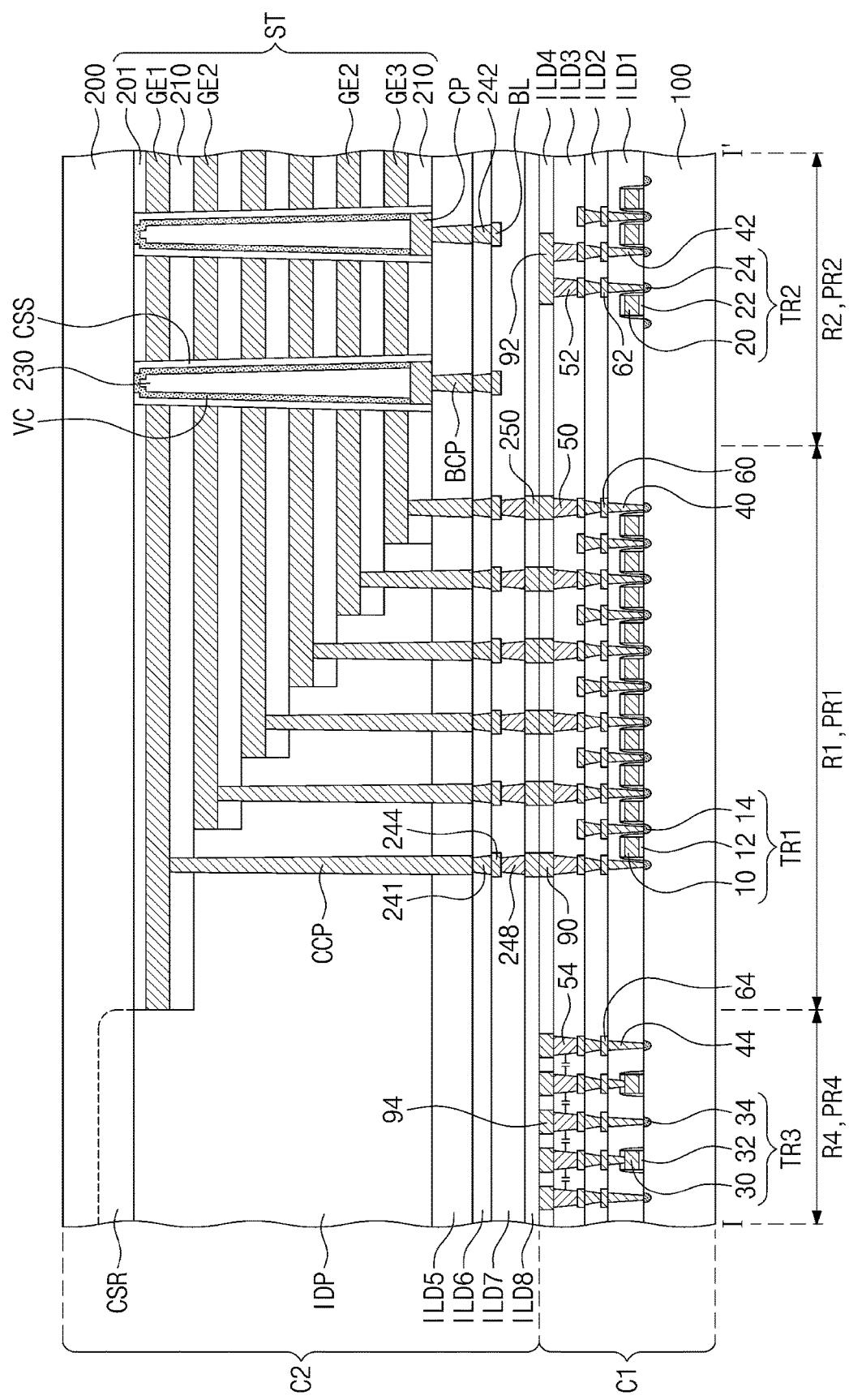
FIG. 8 is a sectional view taken along a line I-I' of FIG. 3 to illustrate a three-dimensional semiconductor memory device according to an embodiment of the inventive concept.

FIG. 8 is a sectional view taken along a line I-I' of FIG. 3 to illustrate a three-dimensional semiconductor memory device according to an embodiment of the inventive concept.

Referring to FIG. 8, the semiconductor pillars SP and gate insulating patterns 240 may be omitted from the second chip C2. In this case, the vertical channel portions VC and the charge storing structures CSS may be in direct contact with the second substrate 200.

Figure 9:
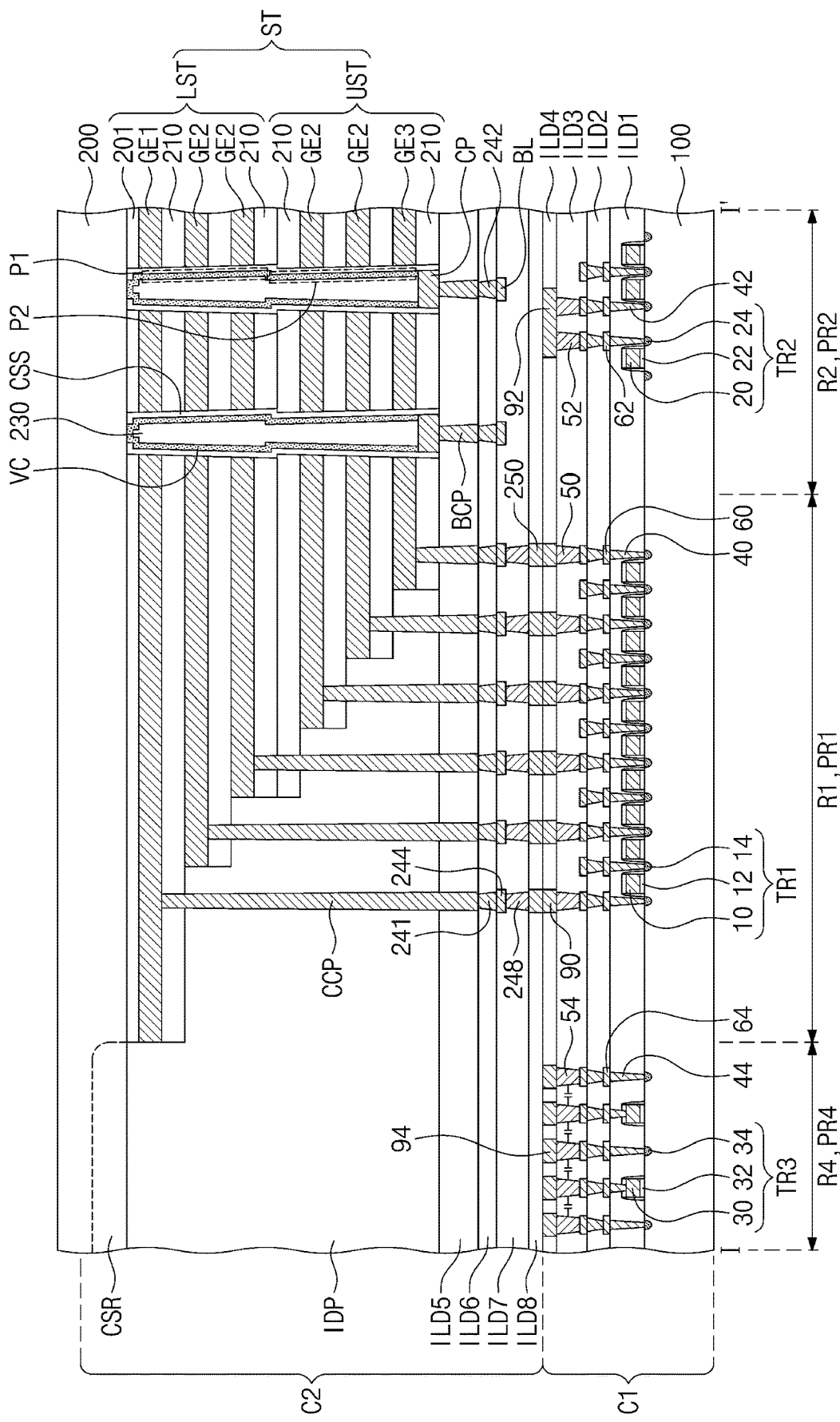
FIG. 9 is a sectional view taken along a line I-I' of FIG. 3 to illustrate a three-dimensional semiconductor memory device according to an embodiment of the inventive concept.

FIG. 9 is a sectional view taken along a line I-I' of FIG. 3 to illustrate a three-dimensional semiconductor memory device according to an embodiment of the inventive concept.

Referring to FIG. 9, each of the stacks ST may include a lower stack LST and an upper stack UST. The lower stack LST may be disposed on the second substrate 200, and the upper stack UST may be disposed on the lower stack LST. The upper stack UST may be disposed between the lower stack LST and the fifth interlayered insulating layer ILD5.

The lower stack LST may include a buffer insulating layer 201, the ground selection gate electrode GE1, the cell gate electrodes GE2, and the insulating patterns 210. The ground selection gate electrode GE1 may be disposed on the buffer insulating layer 201 and the cell gate electrodes GE2 may be sequentially formed on the ground selection gate electrode GE1. The insulating patterns 210 may be disposed between the ground selection gate electrode GE1 and one of the cell gate electrodes GE2 adjacent to the second substrate 200, between adjacent cell gate electrodes GE2, and on another of the cell gate electrodes GE2 farthest from the second substrate 200.

The upper stack UST may be disposed on the lower stack LST. The upper stack UST may include the cell gate electrodes GE2, the string selection gate electrode GE3, and the insulating patterns 210. The cell gate electrodes GE2 of the upper stack UST may be sequentially stacked on the lower stack LST, and the string selection gate electrode GE3 may be disposed on the cell gate electrode GE2, which is distant from the lower stack LST. The insulating patterns 210 of the upper stack UST may be disposed between the cell gate electrodes GE2 and on the string selection gate electrode GE3.

The vertical channel portions VC may be provided to penetrate the lower stack LST and the upper stack UST. Each of the vertical channel portions VC may include the first portion P1 penetrating the lower stack LST and the second portion P2 penetrating the upper stack UST. A sidewall of the first portion P1 of the vertical channel portion VC may be misaligned with a sidewall of the second portion P2 of the vertical channel portion VC. For example, a first sidewall of the first portion P1 of the vertical channel portion VC may not be aligned or may be offset with a second sidewall of the second portion P2 of the vertical channel portion VC. Additionally, in a side-view, a lowermost section of the second portion P2 may have a maximum width in the horizontal direction and an uppermost section of the second portion P2 may have a minimum width. Furthermore, in a side-view, a lowermost section of the first portion P1 may have a maximum width in the horizontal direction and an uppermost section of the first portion P1 may have a minimum width. Further still, at an area of the vertical channel portion VC corresponding to a transition area between the first portion P1 and second portion P2, a sidewall of the first portion P1 may extend outward beyond an edge of a sidewall of the second portion P2.

Figure 10:
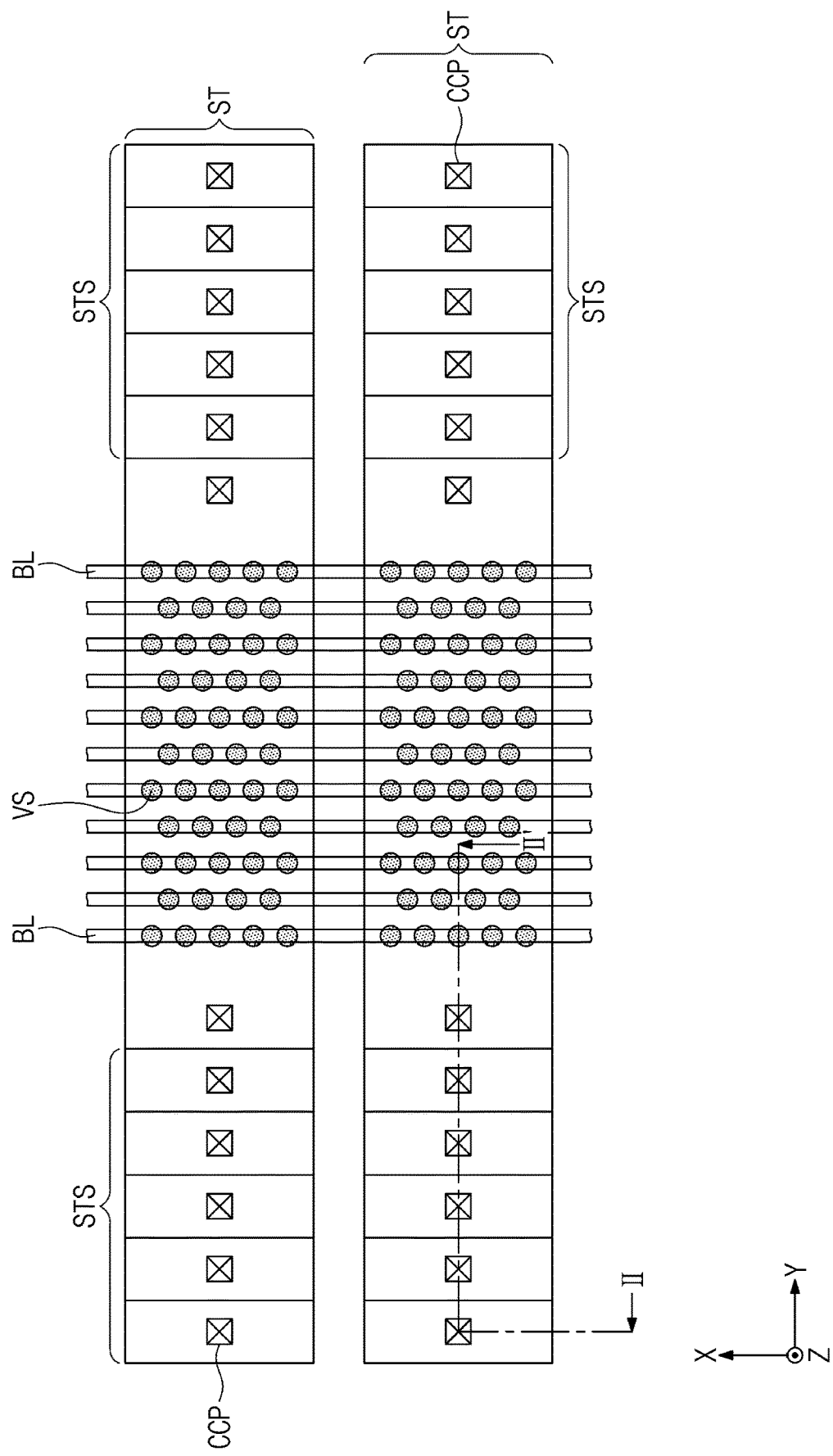
FIG. 10 is a plan view illustrating a three-dimensional semiconductor memory device according to an embodiment of the inventive concept.
Figure 11:
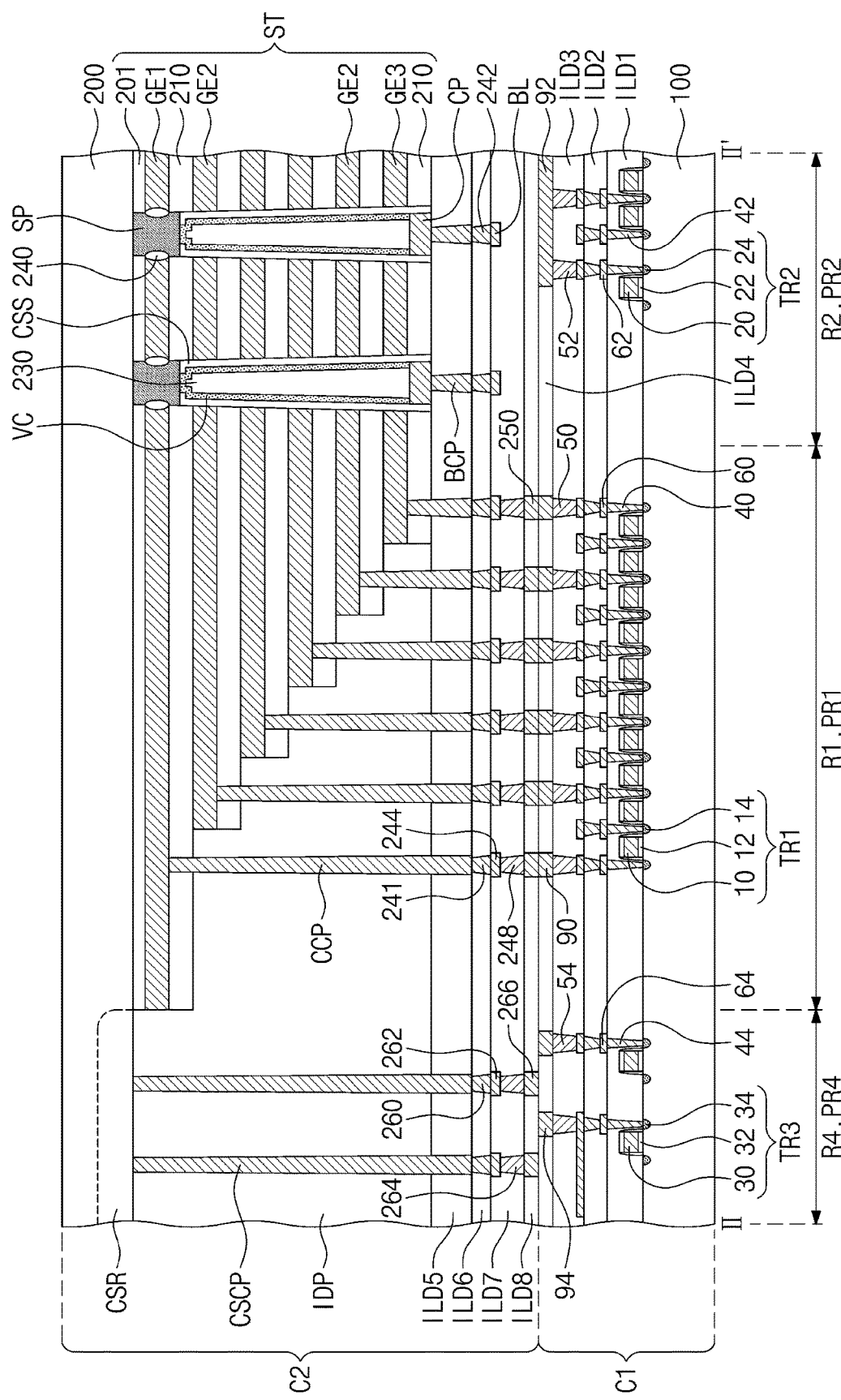
FIG. 11 is a sectional view taken along a line II-II' of FIG. 10 to illustrate a three-dimensional semiconductor memory device according to an embodiment of the inventive concept.

FIG. 10 is a plan view illustrating a three-dimensional semiconductor memory device according to an embodiment of the inventive concept. FIG. 11 is a sectional view taken along a line II-II' of FIG. 10 to illustrate a three-dimensional semiconductor memory device according to an embodiment of the inventive concept.

Referring to FIGS. 10 and 11, the second chip C2 may include common source contact plugs CSCP, seventh vias 260, fifth pads 262, eighth vias 264, and fifth contact lines 266. The common source contact plugs CSCP may be disposed on the fourth regions R4 of the second substrate 200. The common source contact plugs CSCP may be disposed on the fourth regions R4 of the second substrate 200 to penetrate the interlayered insulating pattern IDP and the fifth interlayered insulating layer ILD5 and may be electrically connected to the common source region CSR. The common source contact plugs CSCP may be formed of or include at least one metallic material (e.g., tungsten, copper, and aluminum) or metal nitride (e.g., tungsten nitride, tantalum nitride, titanium nitride, and aluminum nitride).

The seventh vias 260 may be disposed on the common source contact plugs CSCP. The seventh vias 260 may be provided to penetrate the sixth interlayered insulating layer ILD6 and to be in contact with the common source contact plugs CSCP. The fifth pads 262 may be disposed on the seventh vias 260. The fifth pads 262 may be disposed in the seventh interlayered insulating layer ILD7 and may be in contact with the seventh vias 260. The eighth vias 264 may be disposed on the fifth pads 262. The eighth vias 264 may be disposed in the seventh interlayered insulating layer ILD7 and may be in contact with the fifth pads 262. The seventh vias 260, the fifth pads 262, and the eighth vias 264 may be formed of or include at least one metallic material (e.g., copper, tungsten, and aluminum).

The fifth contact lines 266 may be disposed on the eighth vias 264. The fifth contact lines 266 may be disposed in the eighth interlayered insulating layer ILD8 and may be in contact with the eighth vias 264. The fifth contact lines 266 may be misaligned (e.g., not aligned or offset) with the third contact lines 94 when viewed in a plan view. For example, the fifth contact lines 266 may not be in contact with the third contact lines 94. The fifth contact lines 266 and the third contact lines 94 may be electrically disconnected from each other. For example, the fifth contact lines 266 may be electrically disconnected from the third transistors TR3. For example, the third contact lines 94 may be electrically disconnected from the common source region CSR.

In an embodiment, the fifth contact lines 266 may be connected to a driving device applying a voltage to the common source region CSR. Exemplary driving devices may include a circuit or another electrical component used to control a different circuit or electrical component. In certain embodiments, the fifth contact lines 266, along with the third contact lines 94, may constitute a passive device. In this case, the fifth contact lines 266 may constitute a first electrode of a metal-insulate-metal (MIM) capacitor, the third contact lines 94 may constitute a second electrode of the MIM capacitor, and the fourth interlayered insulating layer ILD4 and the eighth interlayered insulating layer ILD8 may be used as a dielectric layer of the MIM capacitor. The fifth contact lines 266 and the third contact lines 94 may be applied with different voltages. In certain embodiments, the fifth contact lines 266 may constitute a passive device, without the coupling with the third contact lines 94. In this case, the fifth contact lines 266 may constitute a capacitor, an inductor, or a resistor.

Figure 12:
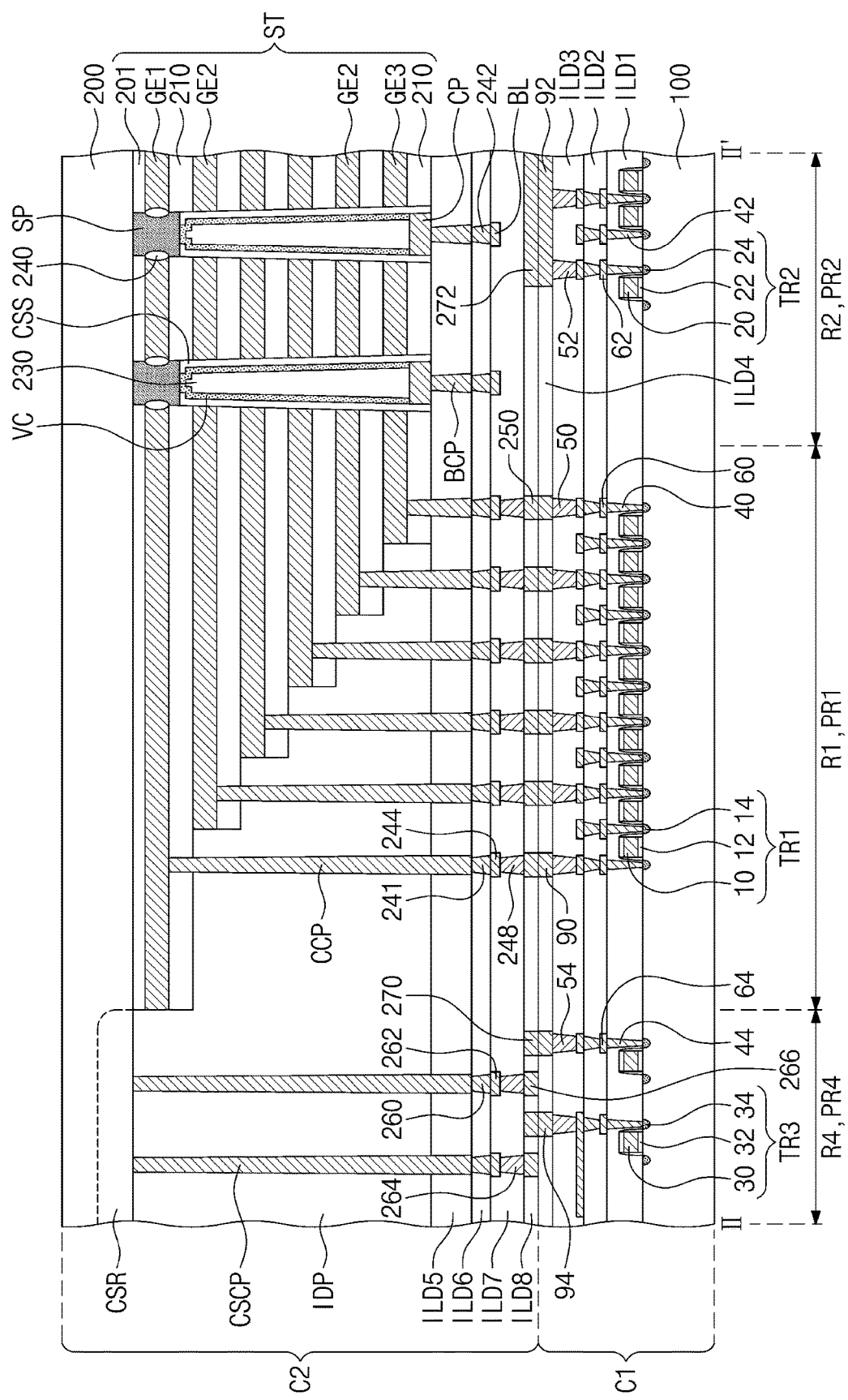
FIG. 12 is a sectional view taken along a line II-II' of FIG. 10 to illustrate a three-dimensional semiconductor memory device according to an embodiment of the inventive concept.

FIG. 12 is a sectional view taken along a line II-II' of FIG. 10 to illustrate a three-dimensional semiconductor memory device according to an embodiment of the inventive concept.

Referring to FIG. 12, the second chip C2 may include seventh contact lines 270 and an eighth contact line 272. The seventh contact lines 270 may be disposed in the eighth interlayered insulating layer ILD8 and may be aligned to the third contact lines 94 in the third direction Z. The seventh contact lines 270 may be in contact with the third contact lines 94 and may be electrically connected to the third contact lines 94. The seventh contact lines 270 may be horizontally shifted from the fifth contact lines 266. The seventh contact lines 270 may be electrically connected to the third transistors TR3. The seventh contact lines 270, along with the third contact lines 94, may constitute a passive device.

The eighth contact line 272 may be disposed in the eighth interlayered insulating layer ILD8 and may be aligned to the second contact line 92 in the third direction Z. The eighth contact line 272 may be in contact with the second contact line 92 and may be electrically connected to the second contact line 92. The eighth contact line 272 may be electrically connected to the second transistors TR2. The eighth contact line 272, along with the second contact line 92, may constitute a passive device.

Figure 13:
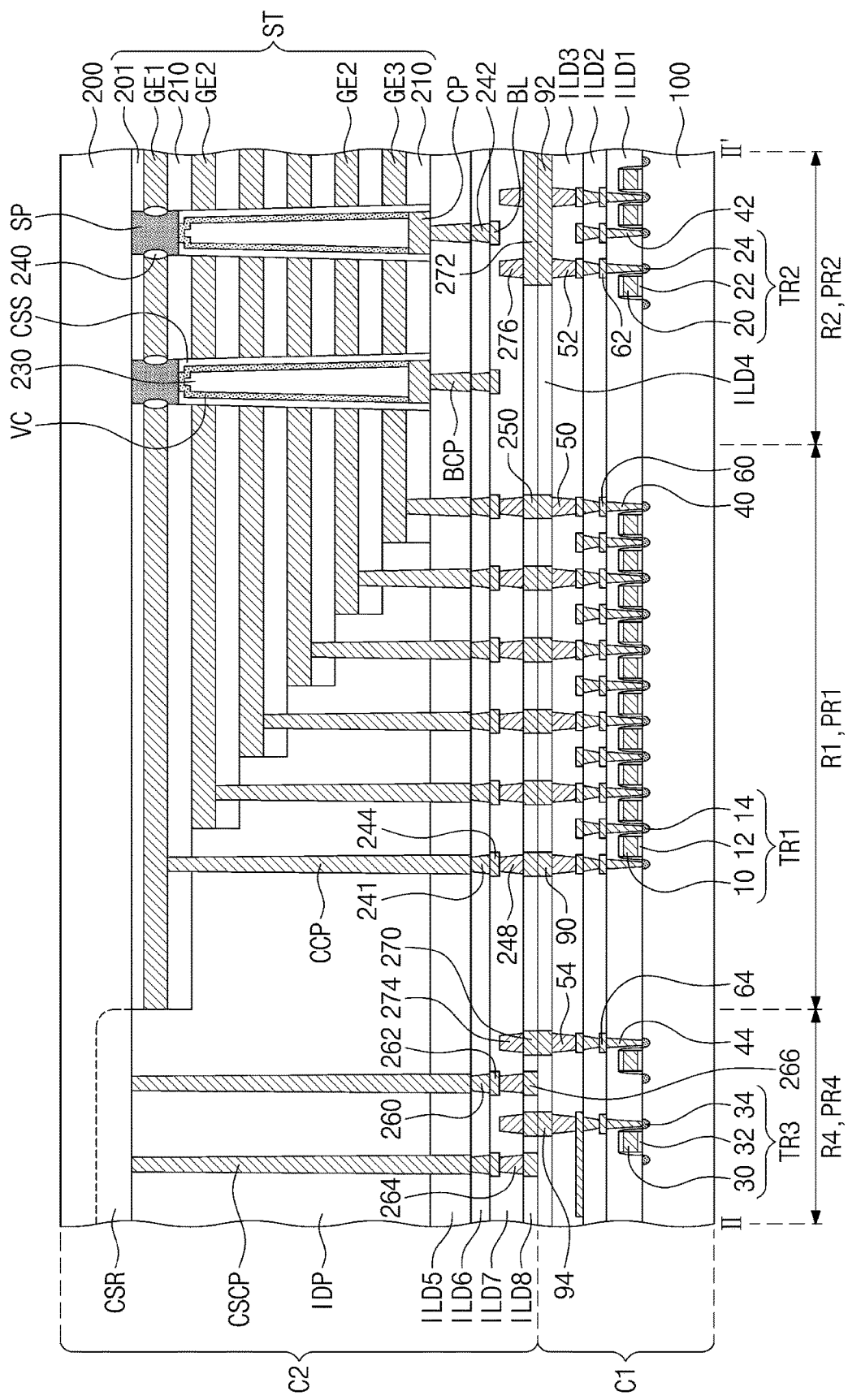
FIG. 13 is a sectional view taken along a line II-II' of FIG. 10 to illustrate a three-dimensional semiconductor memory device according to an embodiment of the inventive concept.

FIG. 13 is a sectional view taken along a line II-II' of FIG. 10 to illustrate a three-dimensional semiconductor memory device according to an embodiment of the inventive concept.

Referring to FIG. 13, the second chip C2 may include ninth vias 274 and tenth vias 276. The ninth vias 274 may be disposed in the seventh interlayered insulating layer ILD7. The ninth vias 274 may be aligned to the seventh contact lines 270 in the third direction Z. The ninth vias 274 may be in contact with the seventh contact lines 270 and may be electrically connected to the seventh contact lines 270. The ninth vias 274 may be horizontally shifted from the eighth vias 264. In other words, the ninth vias 274 may be electrically disconnected from the eighth vias 264 and common source contact plug CSCP. The ninth vias 274 may be electrically connected to the third transistors TR3. The ninth vias 274, along with the seventh contact lines 270 and the third contact lines 94, may constitute a passive device.

The tenth vias 276 may be disposed in the seventh interlayered insulating layer ILD7. The tenth vias 276 may be disposed in the seventh interlayered insulating layer ILD7 to be in contact with the eighth contact line 272 and to be electrically connected to the eighth contact line 272. The tenth vias 276 may be electrically disconnected from the second chip C2. The tenth vias 276 may be electrically connected to the second transistors TR2. The tenth vias 276, along with the eighth contact line 272 and the second contact line 92, may constitute a passive device.

Figure 14:
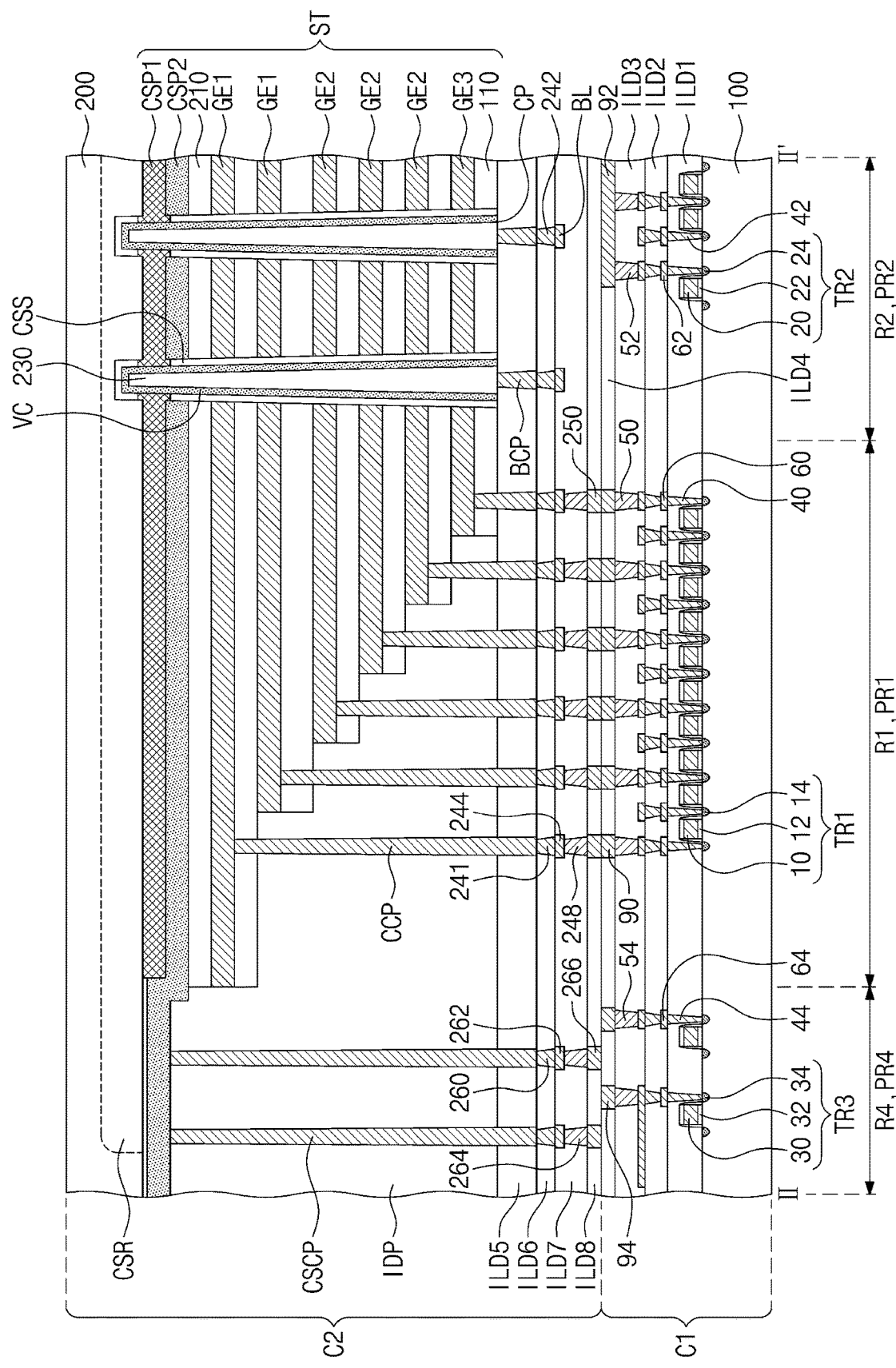
FIG. 14 is a sectional view taken along a line II-II' of FIG. 10 to illustrate a three-dimensional semiconductor memory device according to an embodiment of the inventive concept.

FIG. 14 is a sectional view taken along a line II-II' of FIG. 10 to illustrate a three-dimensional semiconductor memory device according to an embodiment of the inventive concept.

Referring to FIG. 14, the stack ST may include a first source pattern CSP1 and a second source pattern CSP2. The first source pattern CSP1 may be disposed between the second substrate 200 and one of the insulating patterns 210 closest to the second substrate 200, and the second source pattern CSP2 may be disposed between the first source pattern CSP1 and one of the insulating patterns 210 closest to the second substrate 200. The vertical channel portions VC may be provided to penetrate the stack ST and may be partially inserted into the second substrate 200. The first source pattern CSP1 may be extended (e.g., protrude), at least partly, into regions between a portion of a sidewall of the vertical channel portion VC and a portion of a sidewall of the second source pattern CSP2 and between a portion of a sidewall of the vertical channel portion VC and a sidewall of the second substrate 200. For example, the first source pattern CSP1 may protrude, at least partly, into a lower region of the second substrate 200 and an upper region of the second source pattern CSP2 in respective areas proximate to (adjacent to) an upper portion of respective vertical channel portions VC. The common source region CSR may be disposed in the first regions R1, the second region R2, and the fourth regions R4 of the second substrate 200. The common source region CSR may be electrically connected to the first source pattern CSP1. The first source pattern CSP1 and the second source pattern CSP2 may be formed of or include at least one conductive material containing n-type impurities (e.g., phosphorus (P) or arsenic (As)). For example, the first source pattern CSP1 and the second source pattern CSP2 may be n-type poly silicon patterns.

According to an embodiment of the inventive concept, a first chip with transistors and a second chip with a cell array may be vertically stacked, and passive devices may be provided on second to fourth peripheral circuit regions of the first chip PR2, PR3, and PR4, in which bonding pads electrically connecting the transistors of the first chip to the cell arrays of the second chip are not provided. For example, there are no bonding pads in the second to fourth peripheral circuit regions PR2, PR3, and PR4 and passive devices are provided in at least one of the second to fourth peripheral circuit regions PR2, PR3, and PR4. For example, a first passive device(s) may be provided in the second peripheral circuit region PR2, and a different second passive device(s) may be provided in the third peripheral circuit region PR3. Accordingly, it may be possible to improve operational characteristics of three-dimensional semiconductor memory devices, and it may be possible to reduce a chip size, because a passive device is disposed on a region that has not been used so far.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising a first chip and a second chip stacked on the first chip,
wherein the first chip comprises:
a first substrate including a first peripheral circuit region and a second peripheral circuit region;
first contact plugs on the first peripheral circuit region of the first substrate;
second contact plugs on the second peripheral circuit region of the first substrate; and
a first passive device on and electrically connected to the second contact plugs,
wherein the second chip comprises:
a second substrate disposed on the first chip, the second substrate including a cell array region and a contact region, which vertically overlap the second peripheral circuit region and the first peripheral circuit region of the first chip, respectively;
gate electrodes stacked on the cell array region and the contact region of the second substrate and disposed between the first chip and the second substrate of the second chip; and
cell contact plugs disposed on the contact region of the second substrate and on end portions of the gate electrodes and connected to the first contact plugs,
wherein the first passive device is vertically between the gate electrodes and the second contact plugs and includes a first contact line.

2. The device of claim 1, wherein the first chip further comprises second contact lines on the first contact plugs,
the second chip further comprises third contact lines on the cell contact plugs, and
the second contact lines contact the third contact lines.

3. The device of claim 2, wherein, in a cross-sectional view, an upper surface of the passive device is at the same height as a surface of the second contact line of the first chip that is electrically and physically connected to a conductive portion of the second chip.

4. The device of claim 1, wherein the first passive device comprises a plurality of first contact lines,
the plurality of first contact lines are disposed on the second contact plugs and are horizontally spaced apart from each other, and
the plurality of first contact lines constitute electrodes of a capacitor.

5. The device of claim 1, wherein the first passive device physically contacts the second chip and is electrically connected to the first chip, and
the first passive device is electrically disconnected from the second chip where it contacts the second chip.

6. The device of claim 1, wherein the second chip further comprises:
a second contact line disposed on the first passive device and contacting a first surface of the first passive device; and
third contact lines on the cell contact plugs,
wherein the third contact lines electrically connect the first chip and the second chip to each other, and
wherein the second contact line is electrically connected to the first chip and is electrically disconnected from the second chip.

7. The device of claim 6, wherein the second chip further comprises vias, which are disposed on the second contact line and contact the second contact line.

8. The device of claim 1, wherein the first chip further comprises transistors on the second peripheral circuit region of the first substrate,
the transistors comprise peripheral gate electrodes and source/drain regions, which are provided in portions of the first substrate at both sides of the peripheral gate electrodes, and
the second contact plugs are electrically connected to at least one of the source/drain regions and the peripheral gate electrodes.

9. The device of claim 1, wherein the first substrate further comprises a third peripheral circuit region,
the second substrate further comprises an outer region, which vertically overlaps the third peripheral circuit region and is exposed by the gate electrodes,
the first chip further comprises:
transistors on the third peripheral circuit region of the first substrate;
third contact plugs connected to the transistors; and
a second passive device disposed on the third contact plugs and electrically connected to the third contact plugs, wherein
the second passive device includes a second contact line.

10. The device of claim 9, wherein surfaces of the second passive device are coplanar with surfaces of the first passive device.

11. The device of claim 1, wherein the first substrate further comprises a third peripheral circuit region,
the second substrate further comprises an outer region, which vertically overlaps with the third peripheral circuit region and is exposed by the gate electrodes, and
a common source region, which is disposed in the outer region of the second substrate,
the first chip comprises:
transistors on the third peripheral circuit region of the first substrate;
third contact plugs connected to the transistors; and
second contact lines, which are disposed on the third contact plugs and are connected to the third contact plugs,
the second chip comprises:
common source contacts on the outer region of the second substrate; and
third contact lines, which are disposed on the common source contacts and are connected to the common source contacts, and
the third contact lines are misaligned with the second contact lines, when viewed in a plan view.

12. The device of claim 11, wherein the second contact lines and the third contact lines adjacent to each other constitute electrodes of a capacitor.

13. The device of claim 11, wherein the second contact lines constitute a passive device, and the third contact lines are connected to a driving device configured to apply a voltage to the common source region.

14. The device of claim 1, wherein the gate electrodes comprise a first gate electrode and a second gate electrode on the first gate electrode,
the second chip further comprises a vertical channel portion, which is disposed on the cell array region of the second substrate to penetrate the first and second gate electrodes,
the vertical channel portion comprises a first portion, which penetrates the first gate electrode, and a second portion, which is disposed on the first portion to penetrate the second gate electrode, and
a sidewall of the first portion is aligned with a sidewall of the second portion.

15. The device of claim 1, wherein the gate electrodes comprise a first gate electrode and a second gate electrode on the first gate electrode,
the three-dimensional semiconductor memory device further comprises a vertical channel portion, which is disposed on the cell array region of the second substrate to penetrate the gate electrodes,
the vertical channel portion comprises a first portion, which penetrates the first gate electrode, and a second portion, which is disposed on the first portion to penetrate the second gate electrode, and
the first portion is misaligned with the second portion.

16. The device of claim 1, wherein the gate electrodes comprise an uppermost gate electrode adjacent to the second substrate,
the second chip further comprises:
a first source pattern between the second substrate and the uppermost gate electrode;
a second source pattern between the first source pattern and the uppermost gate electrode; and
a vertical channel portion, which is disposed on the cell array region of the second substrate to penetrate the gate electrodes and the first and second source patterns and is disposed in a portion of the second substrate, and
the first source pattern contacts a sidewall of the vertical channel portion and is extended into regions between a portion of the sidewall of the vertical channel portion and a sidewall of the second source pattern and between a portion of the sidewall of the vertical channel portion and a portion of the sidewall of the second substrate.

17. The device of claim 1, wherein, from a top-down view, the contact region of the second chip corresponds to a bonding region where the first chip is electrically and physically connected to the second chip, and
wherein, from a top-down view, the cell array region of the second chip corresponds to a non-bonding region where the first chip is not electrically connected to the second chip.

18. A three-dimensional semiconductor memory device, comprising:
a first substrate including a first peripheral circuit region and a second peripheral circuit region;
first transistors on the first peripheral circuit region of the first substrate;
first contact plugs connected to the first transistors;
first contact lines on the first contact plugs;
second transistors on the second peripheral circuit region of the first substrate;
second contact plugs connected to the second transistors;
a second substrate disposed on the first contact lines, the second substrate comprising a first region and a second region, which vertically overlap the first peripheral circuit region and the second peripheral circuit region, respectively;

gate electrodes stacked on the second region of the second substrate and between the second substrate and the second contact plugs; and cell contact plugs, which are disposed on the second region of the second substrate and on end portions of the gate electrodes and are connected to the second contact plugs, wherein the first contact lines are electrically disconnected from the second substrate.

19. The device of claim 18, further comprising:

second contact lines on the second contact plugs; and third contact lines between the cell contact plugs and the second contact lines, wherein the second contact lines contact the third contact lines.

20. A three-dimensional semiconductor memory device, comprising:

a first substrate including a first peripheral circuit region and a second peripheral circuit region;

first transistors on the first peripheral circuit region of the first substrate;

an interlayered insulating layer covering the first transistors on the first substrate;

first contact plugs, which are provided to penetrate the interlayered insulating layer and are connected to the first transistors;

first contact lines on the first contact plugs;

a second substrate disposed on the interlayered insulating layer, the second substrate comprising a first region and a second region, which vertically overlap with the first peripheral circuit region and the second peripheral circuit region, respectively;

gate electrodes, which are disposed between the second substrate and the interlayered insulating layer and are stacked on the second region of the second substrate; and vertical channel portions penetrating the gate electrodes, wherein adjacent first contact lines of the first contact lines constitute electrodes of a capacitor.

* * * * *